(12) United States Patent
Ootorii et al.

(10) Patent No.: US 10,483,413 B2
(45) Date of Patent: Nov. 19, 2019

(54) PHOTOELECTRIC MODULE AND OPTICAL DEVICE

(71) Applicant: Sony Corporation, Tokyo (JP)

(72) Inventors: Hiizu Ootorii, Kanagawa (JP); Kazunao Oniki, Tokyo (JP); Koki Uchino, Tokyo (JP); Hideyuki Suzuki, Kanagawa (JP); Hiroshi Ozaki, Kanagawa (JP); Kazuki Sano, Kumamoto (JP); Eiji Otani, Kanagawa (JP); Shinji Rokuhara, Kanagawa (JP); Kiwamu Adachi, Kanagawa (JP); Shuichi Oka, Kanagawa (JP); Shusaku Yanagawa, Kanagawa (JP); Hiroshi Morita, Kanagawa (JP); Takeshi Ogura, Kanagawa (JP)

(73) Assignee: Sony Corporation, Tokyo (JP)

( * ) Notice: Subject to any disclaimer, the term of this patent is extended or adjusted under 35 U.S.C. 154(b) by 378 days.

(21) Appl. No.: 15/303,111

(22) PCT Filed: Apr. 23, 2015

(86) PCT No.: PCT/JP2015/062355
§ 371 (c)(1),
(2) Date: Oct. 10, 2016

(87) PCT Pub. No.: WO2015/174239
PCT Pub. Date: Nov. 19, 2015

(65) Prior Publication Data
US 2017/0170339 A1    Jun. 15, 2017

(30) Foreign Application Priority Data
May 13, 2014    (JP) .................................. 2014-099695

(51) Int. Cl.
*H01L 31/0232*    (2014.01)
*G02B 6/42*    (2006.01)

(52) U.S. Cl.
CPC ........ *H01L 31/0232* (2013.01); *G02B 6/4212* (2013.01); *G02B 6/4214* (2013.01)

(58) Field of Classification Search
CPC ............. H01L 31/0232; H01L 31/0203; H01L 31/02325; H01L 33/00; H01L 2224/16225;
(Continued)

(56) References Cited

U.S. PATENT DOCUMENTS 6,477,286 B1    11/2002    Ouchi
7,539,366 B1 *    5/2009    Baks ................... G02B 6/4201
                                                         385/14
(Continued)

FOREIGN PATENT DOCUMENTS

CN    1825150    8/2006
JP    2001-036197 A    2/2001
(Continued)

OTHER PUBLICATIONS

International Search Report (with English translation) dated Jul. 28, 2015 in international application No. PCT/JP2015/062355 (5 pages).
(Continued)

*Primary Examiner* — Georgia Y Epps
*Assistant Examiner* — Don J Williams
(74) *Attorney, Agent, or Firm* — K&L Gates LLP

(57) ABSTRACT

A photoelectric module of the present disclosure includes an optical device including an optical function element array made of a first base material, and a plurality of light emitting/receiving elements made of a second base material, wherein the optical function element array includes an optical substrate and a plurality of optical function elements,
(Continued)

the optical substrate having a first surface and a second surface, and the optical function elements being integrated with the optical substrate and being arranged one-dimensionally or two-dimensionally, and the light emitting/receiving elements and their respective optical function elements face each other with the optical substrate in between to be located on a same axis in a direction perpendicular to the optical substrate, and the light emitting/receiving elements are disposed on the second surface with a space in between while being separated in units of a smaller number than array number in the optical function element array.

16 Claims, 21 Drawing Sheets

(58) Field of Classification Search
CPC ............. H01S 5/02288; H01S 5/02272; G02B 6/4202; G02B 6/4212; G02B 6/4214; G02B 6/4232; G02B 6/43
See application file for complete search history.

(56) References Cited

U.S. PATENT DOCUMENTS

| | | | | |
|---|---|---|---|---|
| 8,265,432 | B2* | 9/2012 | Doany | G02B 6/4201 257/432 |
| 2004/0173891 | A1* | 9/2004 | Imai | H01L 23/49827 257/686 |
| 2006/0187798 | A1 | 8/2006 | Ozawa et al. | |
| 2009/0290836 | A1 | 11/2009 | Lee et al. | |
| 2012/0138961 | A1* | 6/2012 | Huang | G02B 6/4249 257/81 |
| 2013/0269743 | A1* | 10/2013 | Tajima | H01L 35/30 136/205 |

FOREIGN PATENT DOCUMENTS

| | | |
|---|---|---|
| JP | 2001-185752 A | 7/2001 |
| JP | 2006-235115 A | 9/2006 |
| JP | 2009-252777 A | 10/2009 |
| JP | 2009-265676 A | 11/2009 |
| JP | 2012-137765 A | 7/2012 |
| JP | 2013-142732 A | 7/2013 |
| TW | 201337372 | 9/2013 |
| WO | 2013/100995 A1 | 7/2013 |
| WO | 2013/115780 A1 | 8/2013 |

OTHER PUBLICATIONS

Written Opinion dated Jul. 28, 2015 in international application No. PCT/JP2015/062355 (4 pages).
Benjamin et al., Assembly Development of 1.3 Tb/s Full Duplex Optical Module, 2013 IEEE 63rd Electronic Components and Technology Conference, pp. 292-296.
Japanese Office Action dated Jan. 8, 2019 in corresponding Japanese Application No. 2016-519189.
Chinese Office Action dated Oct. 9, 2018 in corresponding Chinese Application No. 2015800231649.
Japanese Office Action dated Aug. 13, 2019 in corresponding Japanese Application No. 2016-519189.

* cited by examiner

[ FIG. 1 ]
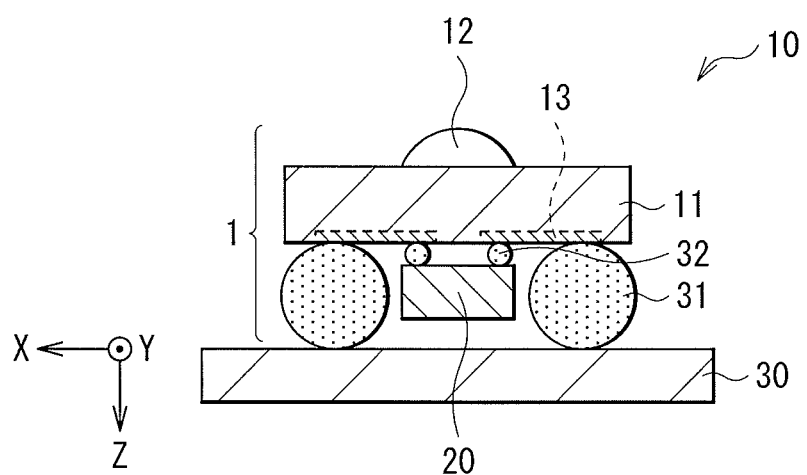
[ FIG. 2 ]
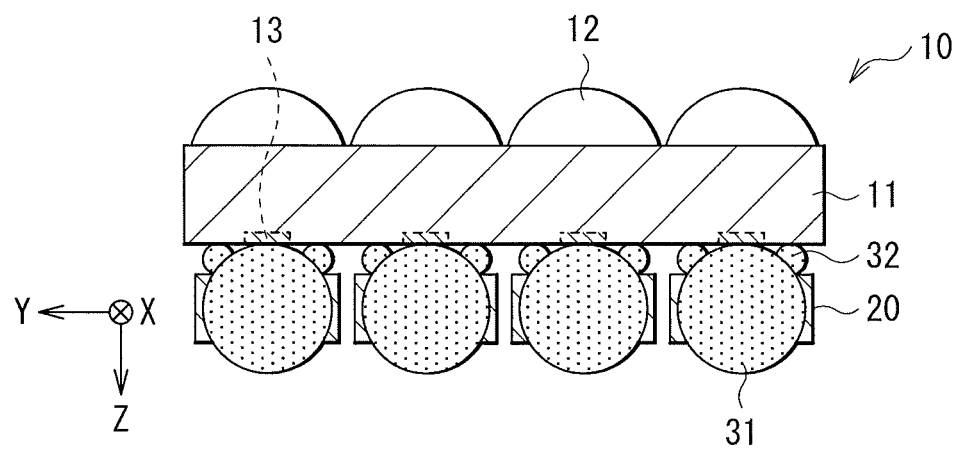

[ FIG. 3 ]
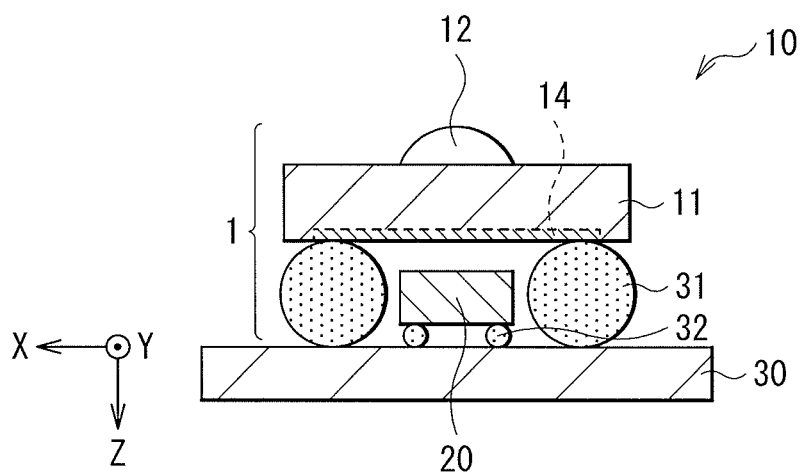
[ FIG. 4 ]
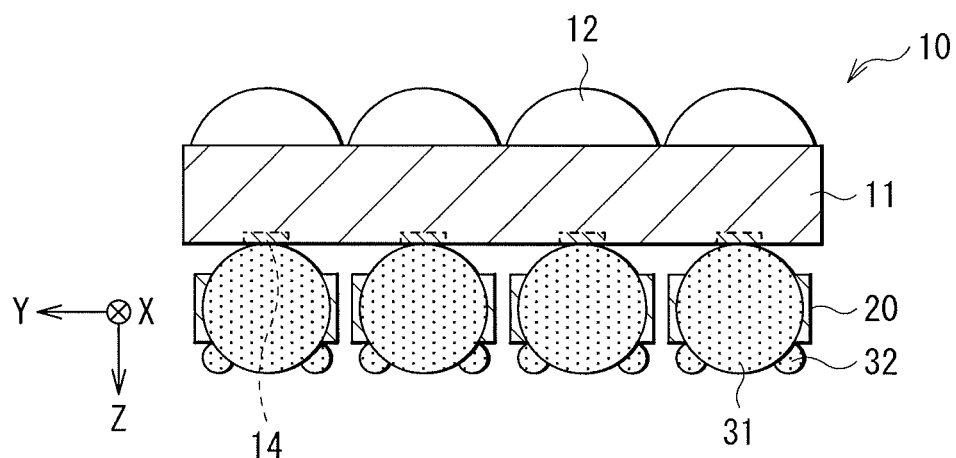

[ FIG. 5 ]
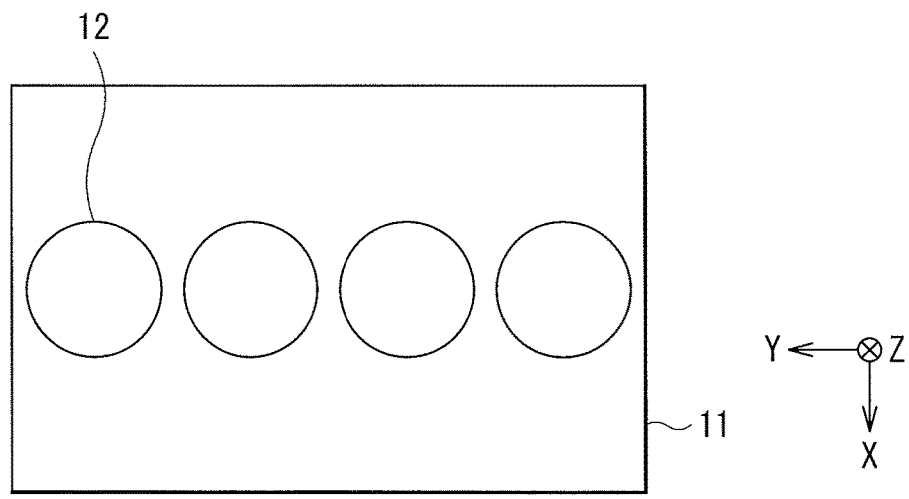
[ FIG. 6 ]
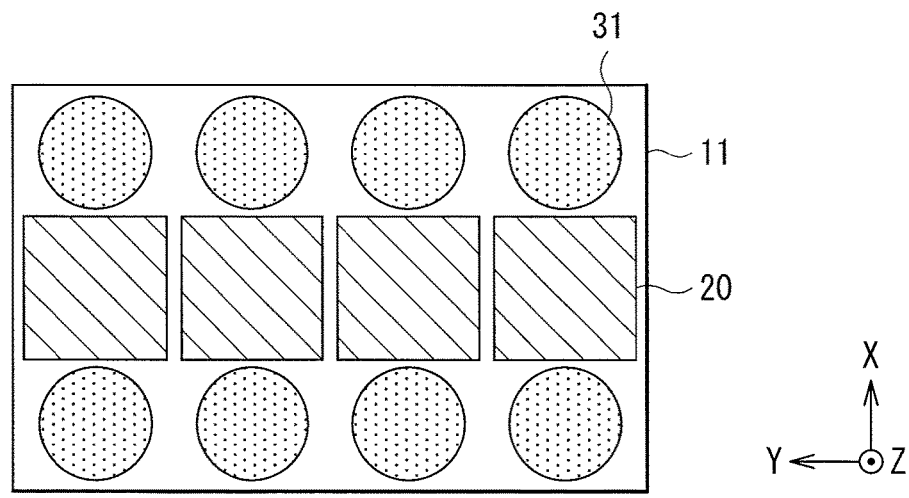

[ FIG. 7 ]
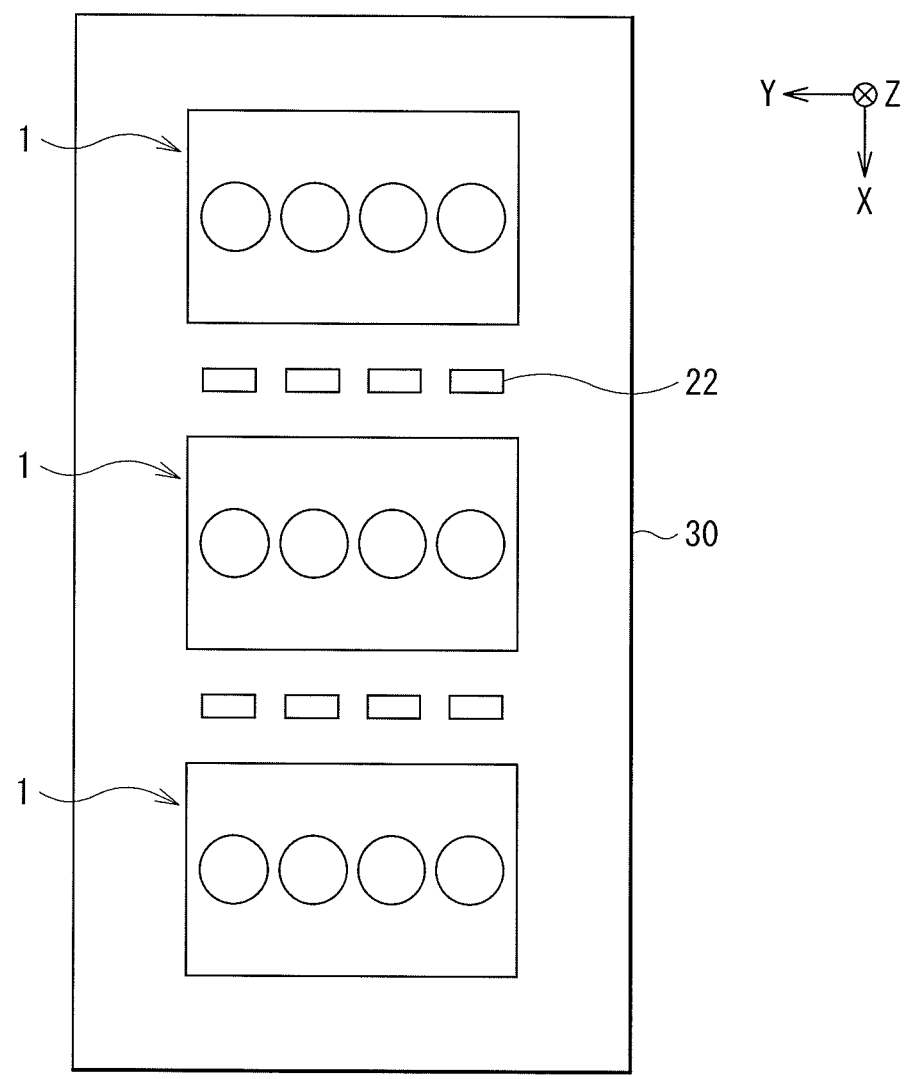

[ FIG. 8 ]
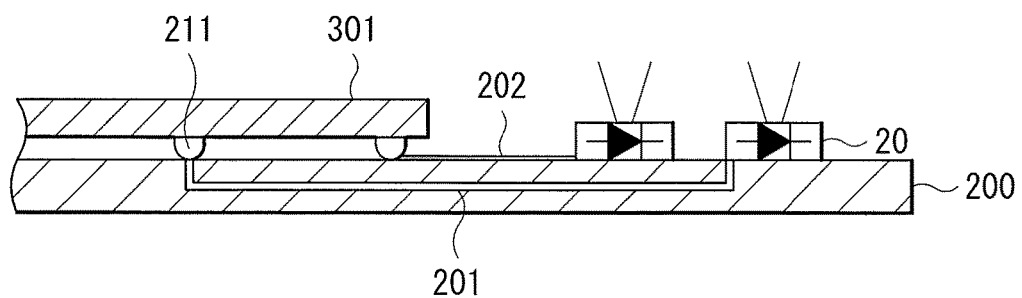
[ FIG. 9 ]
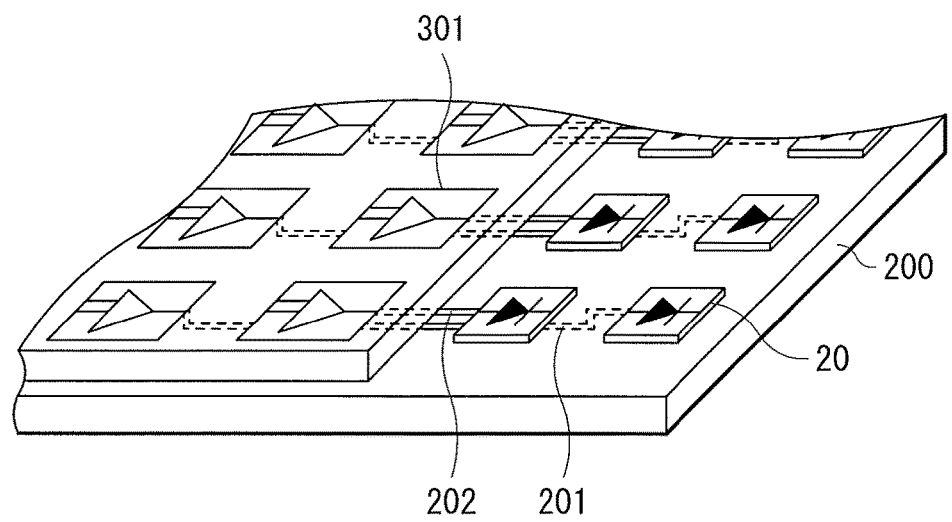

[ FIG. 10 ]
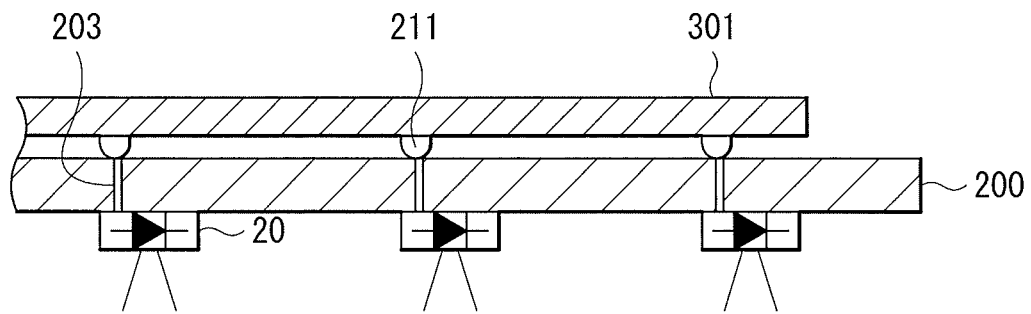
[ FIG. 11 ]
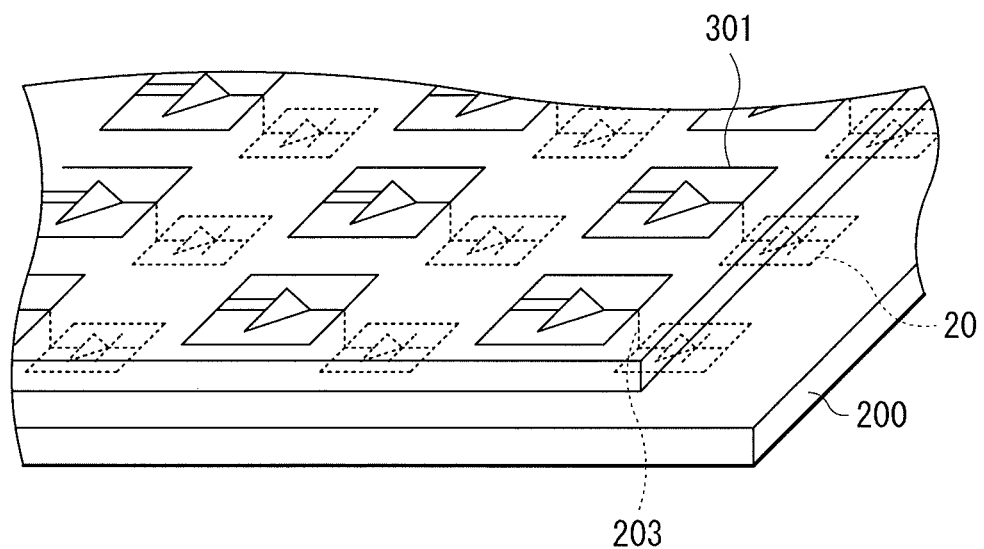

[FIG. 12]
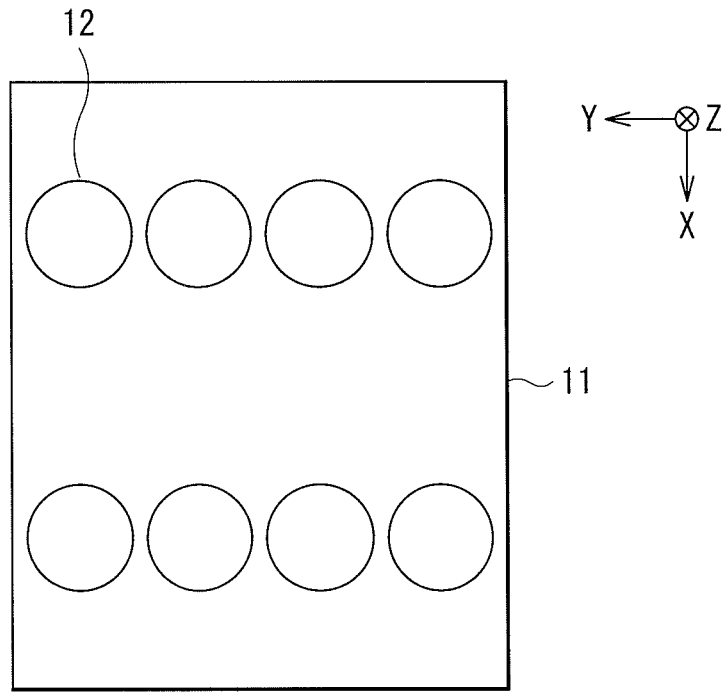
[FIG. 13]
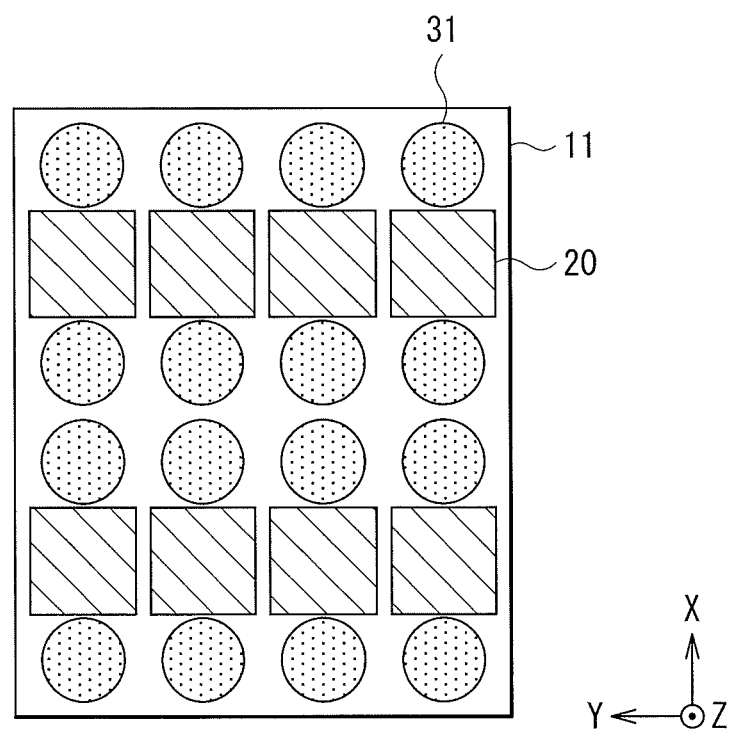

[ FIG. 14 ]
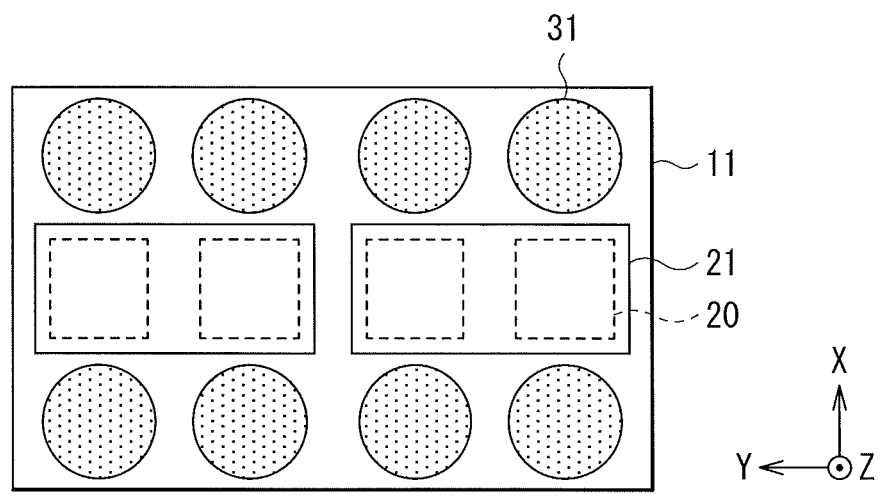
[ FIG. 15 ]
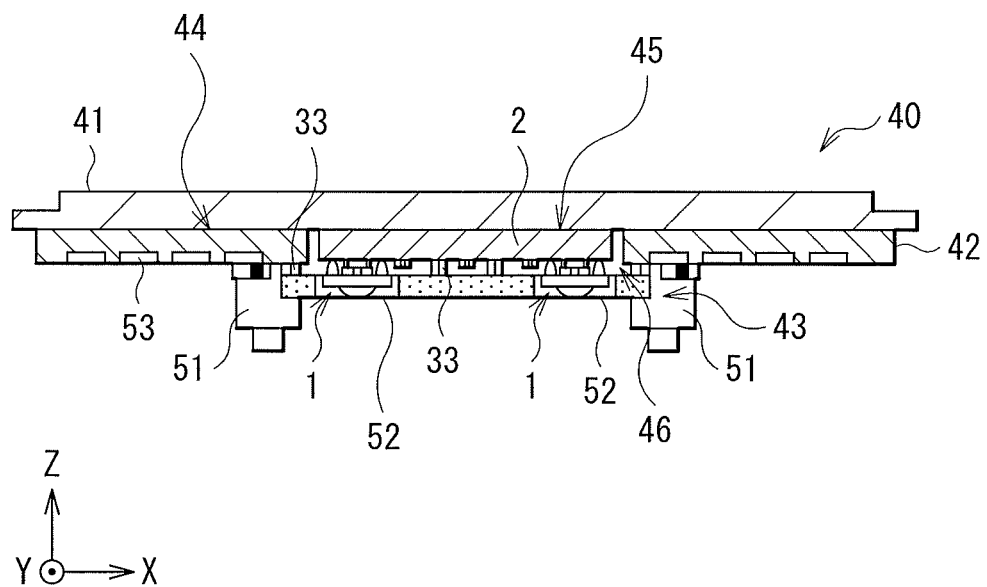

[ FIG. 16 ]
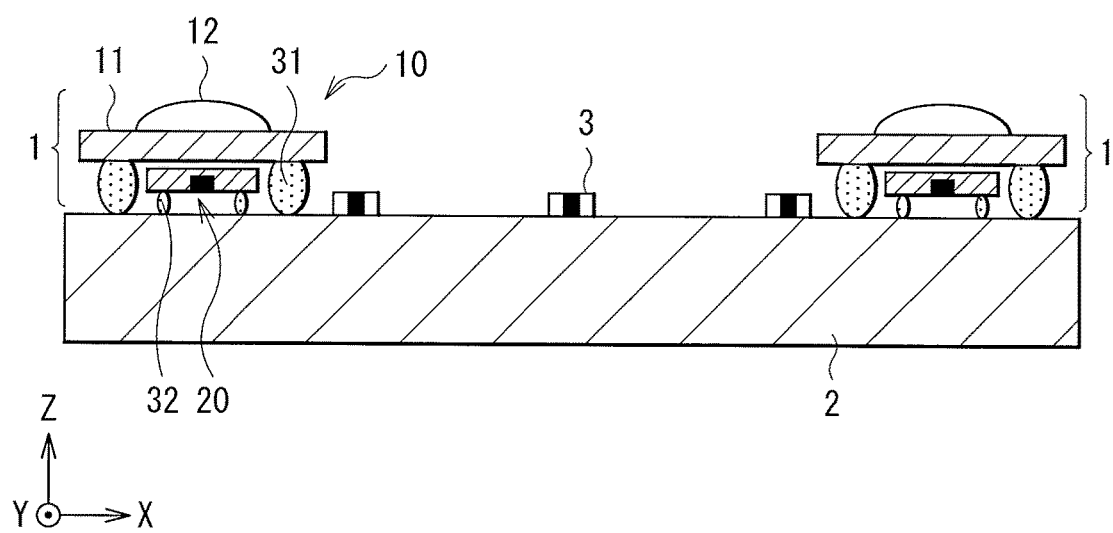

[ FIG. 17 ]
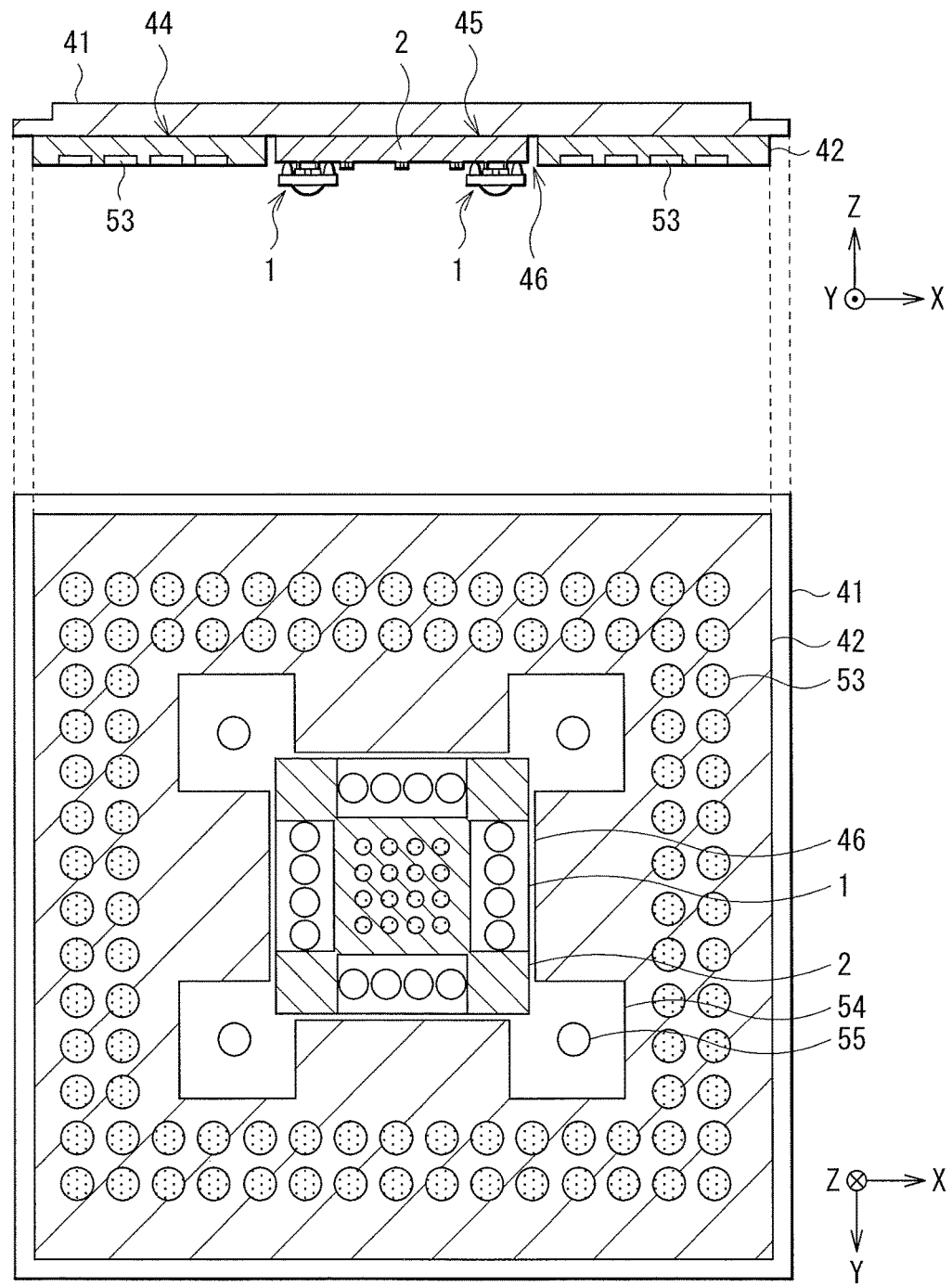

[ FIG. 18 ]
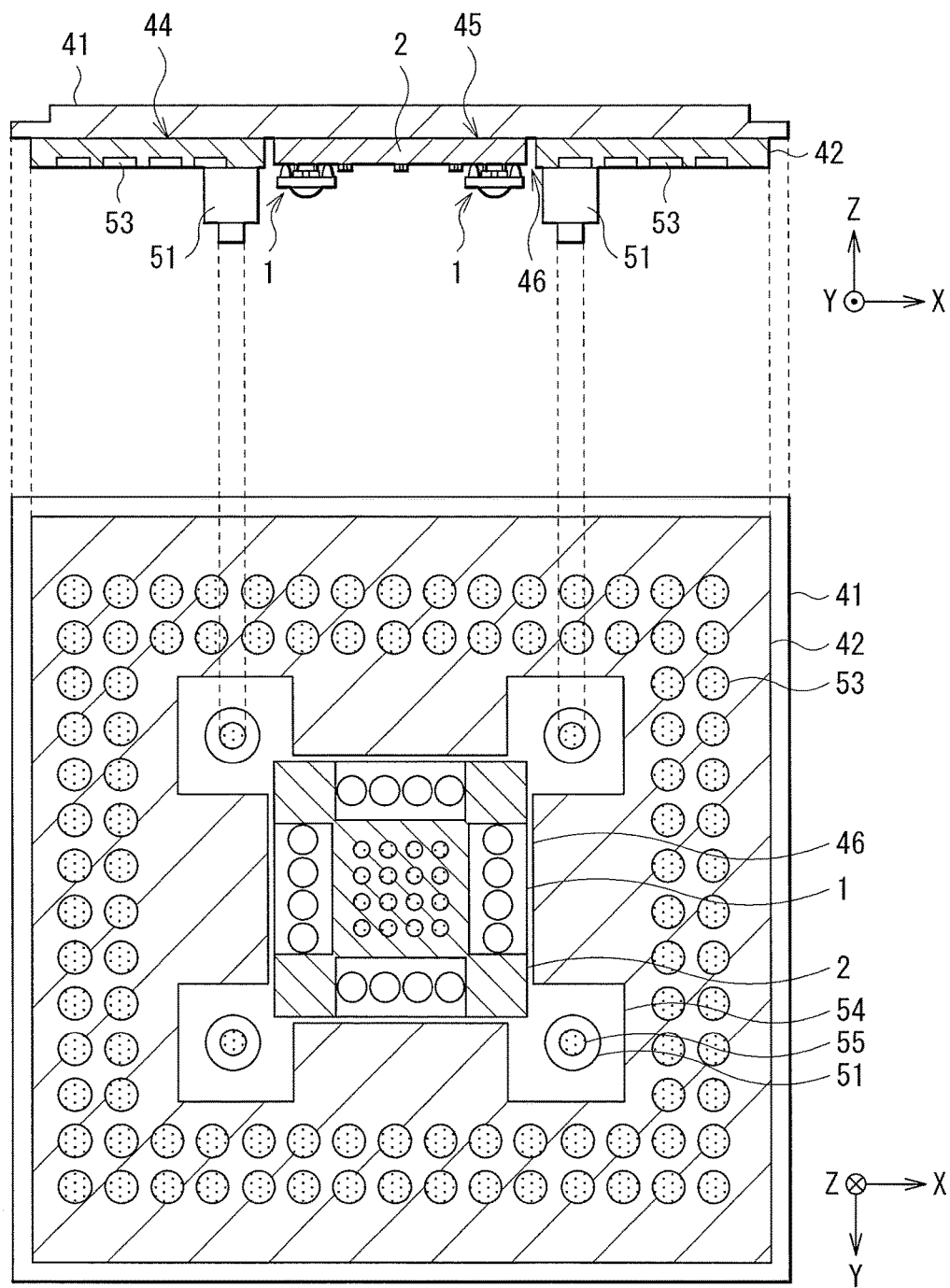

[ FIG. 19 ]
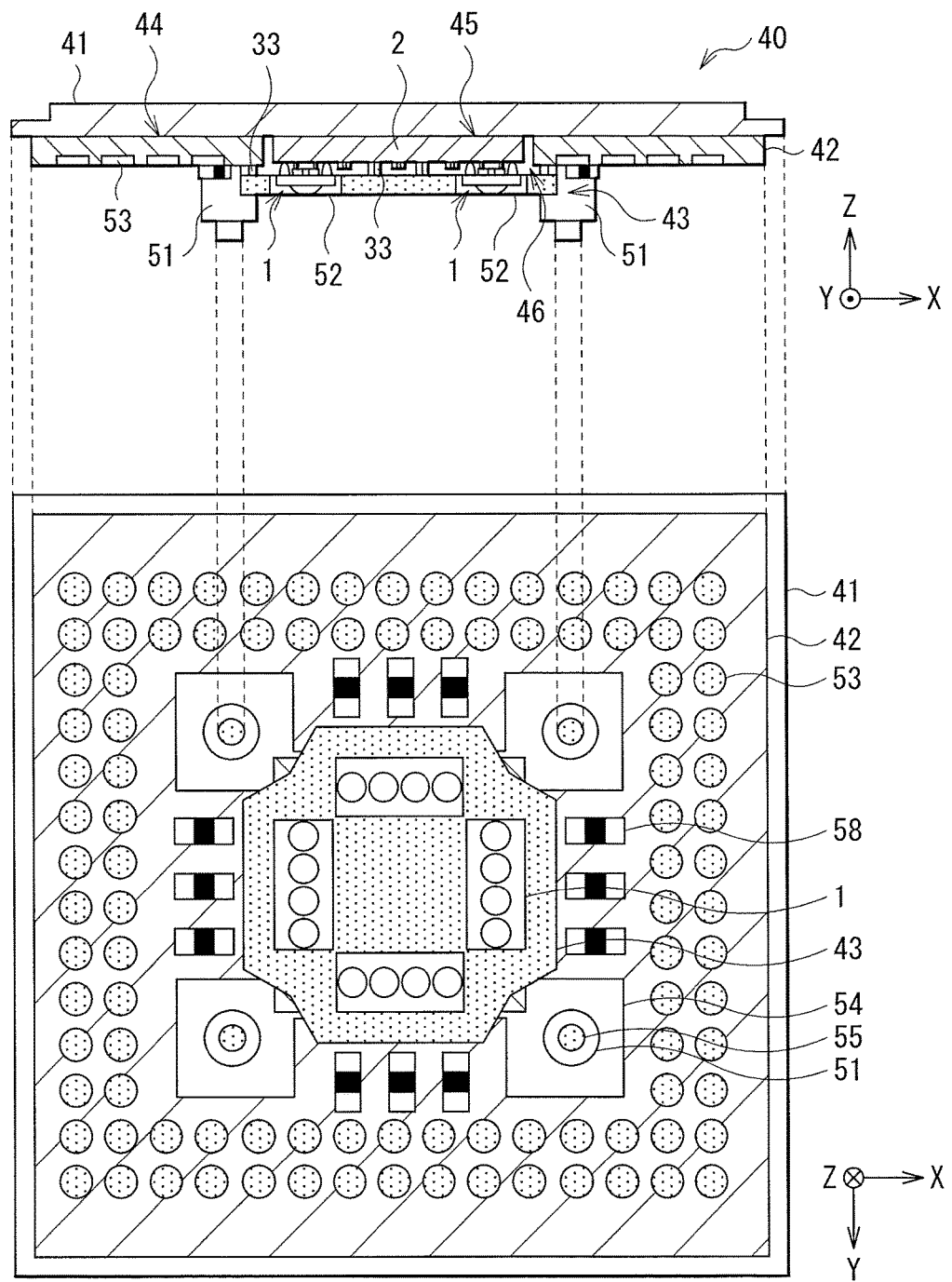

[ FIG. 20 ]
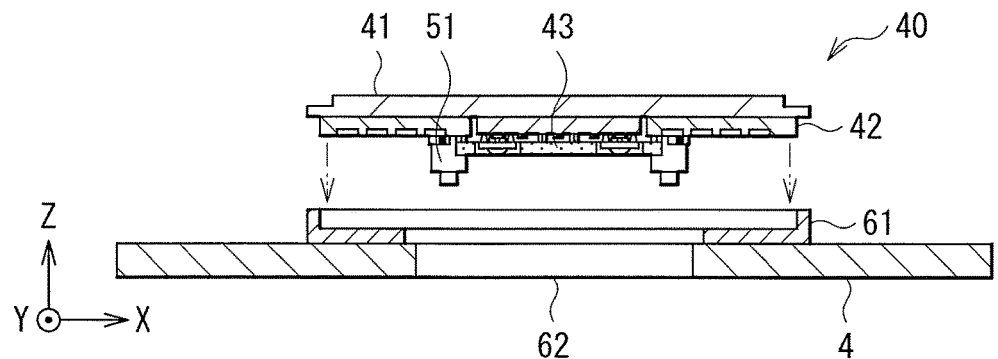
[ FIG. 21 ]
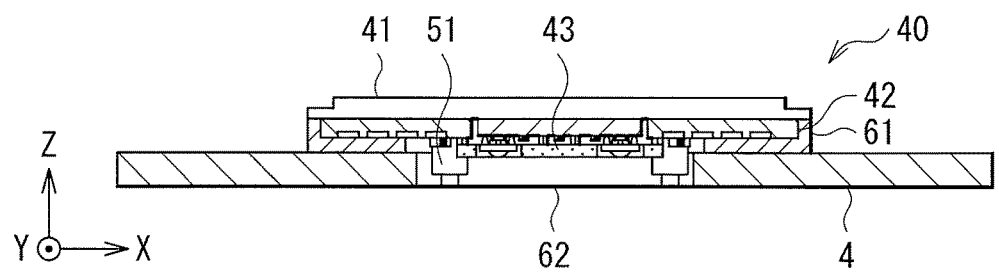
[ FIG. 22 ]
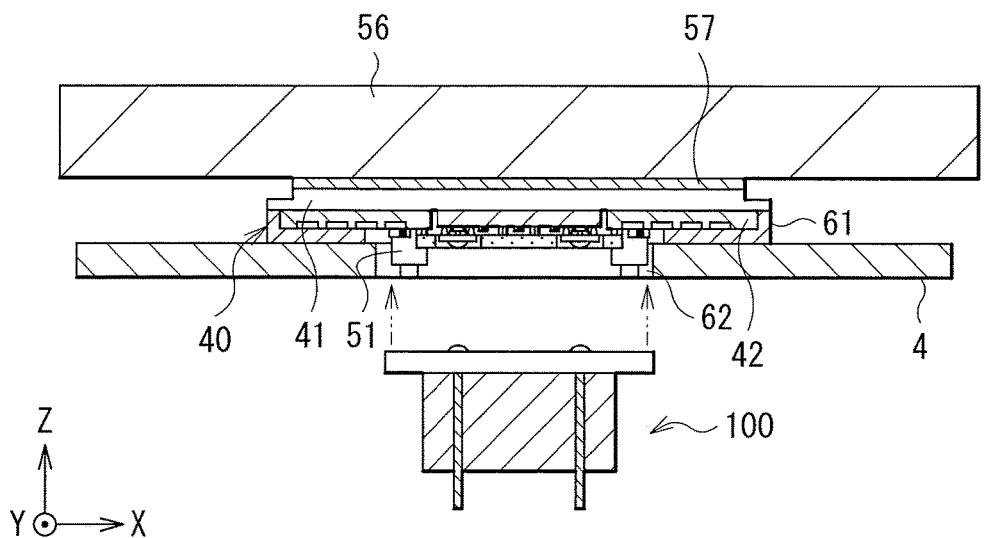

[ FIG. 23 ]
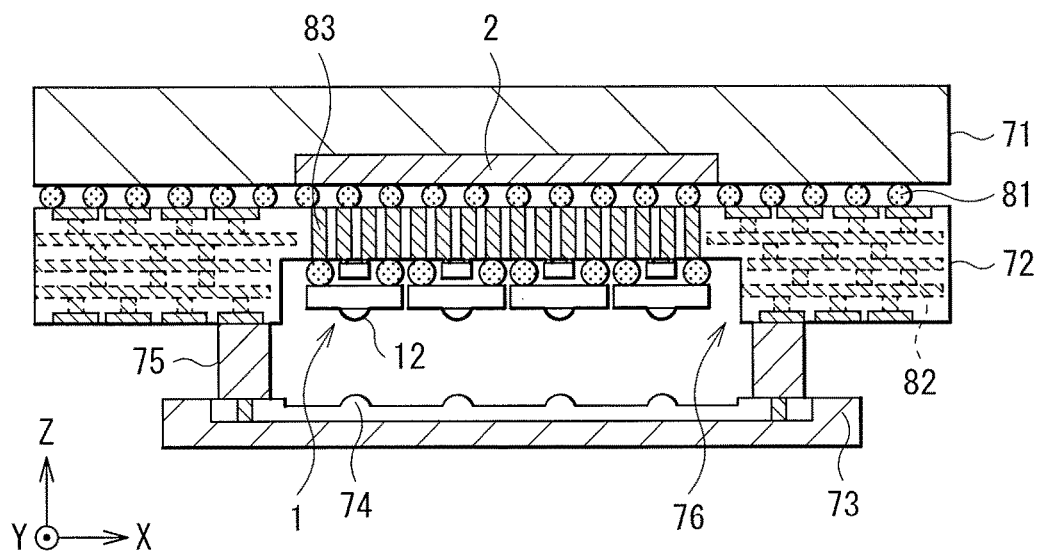
[ FIG. 24 ]
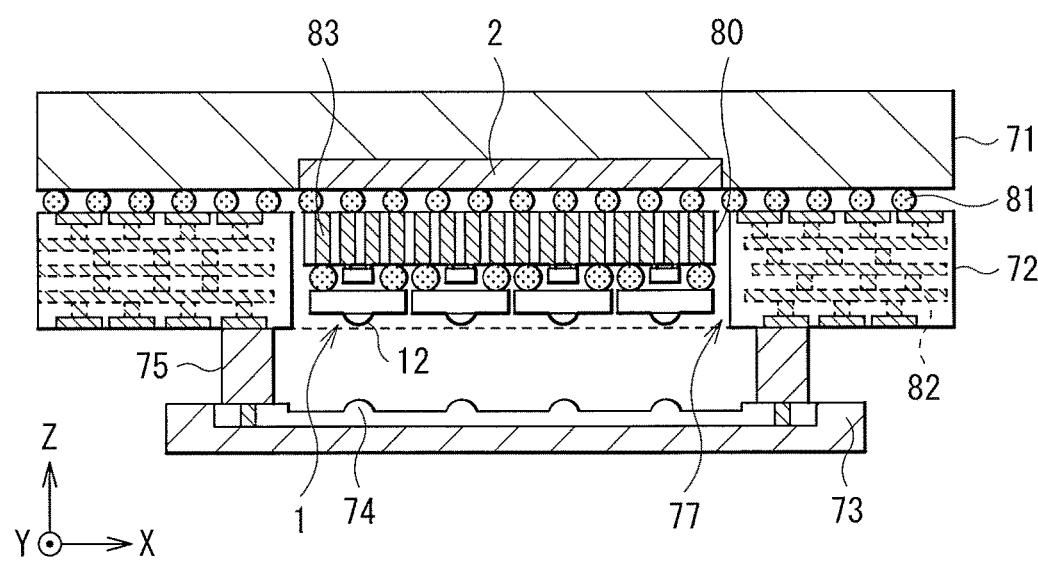

[ FIG. 25 ]
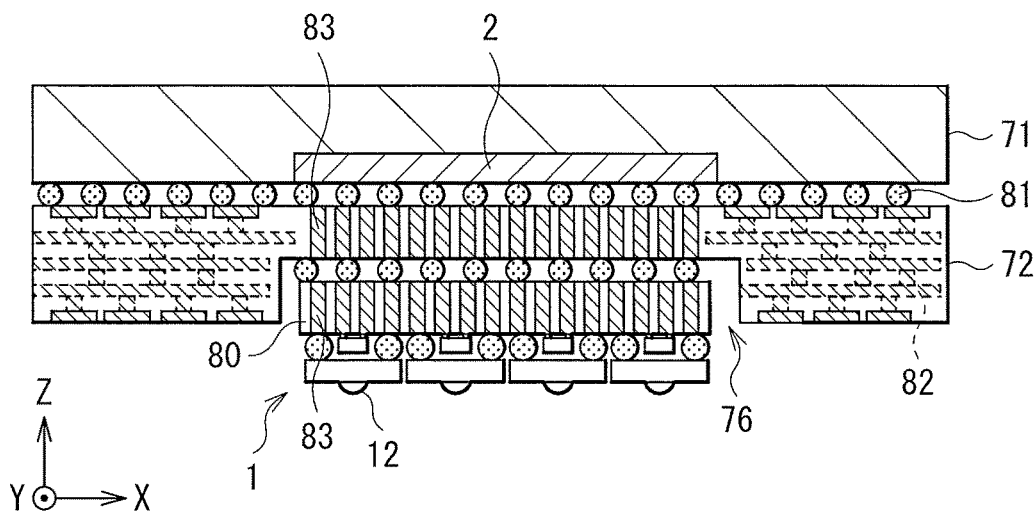
[ FIG. 26 ]
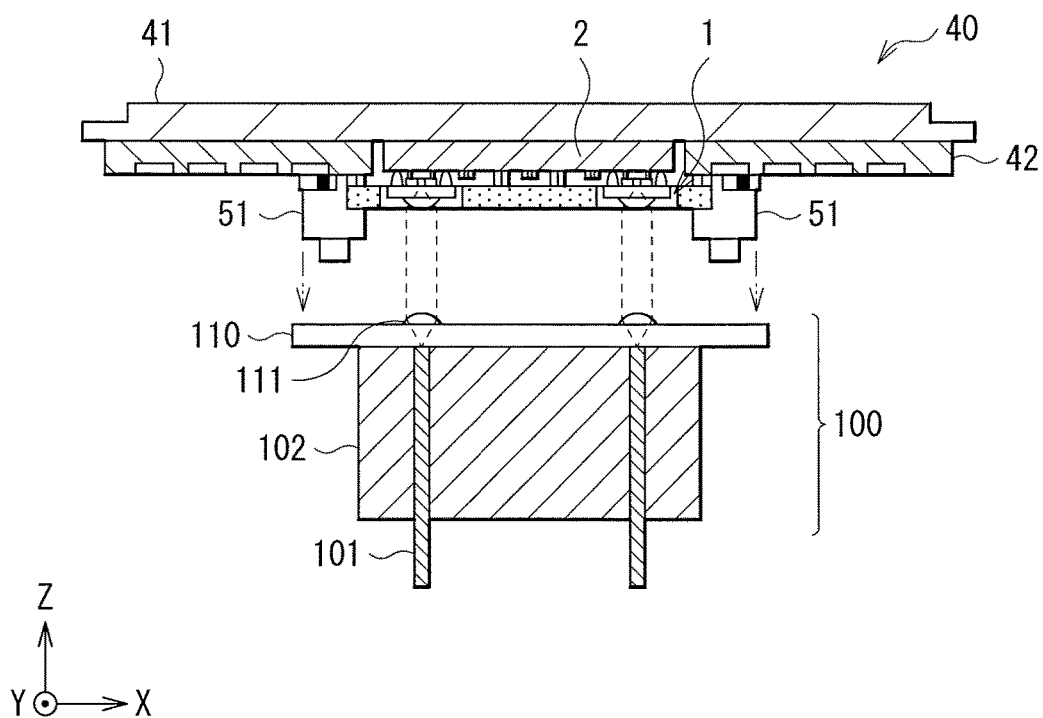

[ FIG. 27 ]
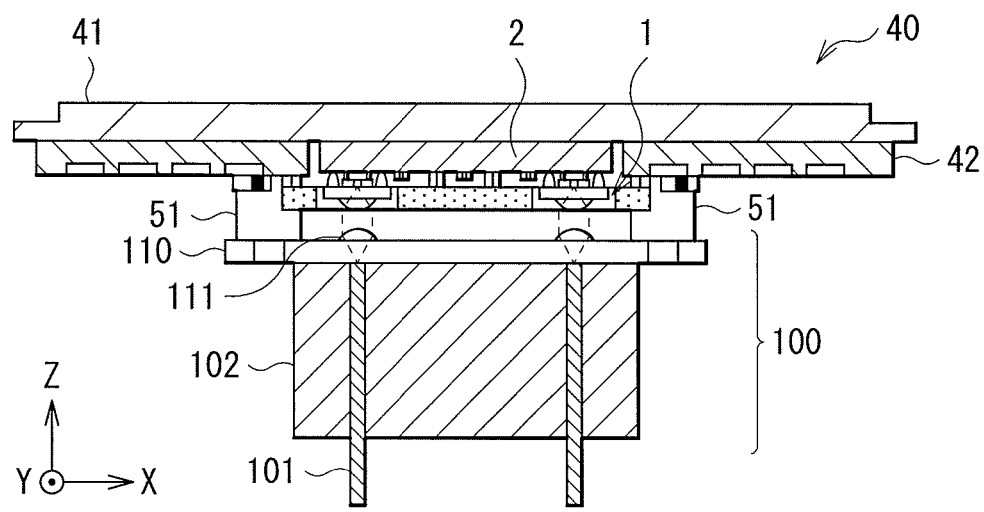
[ FIG. 28 ]
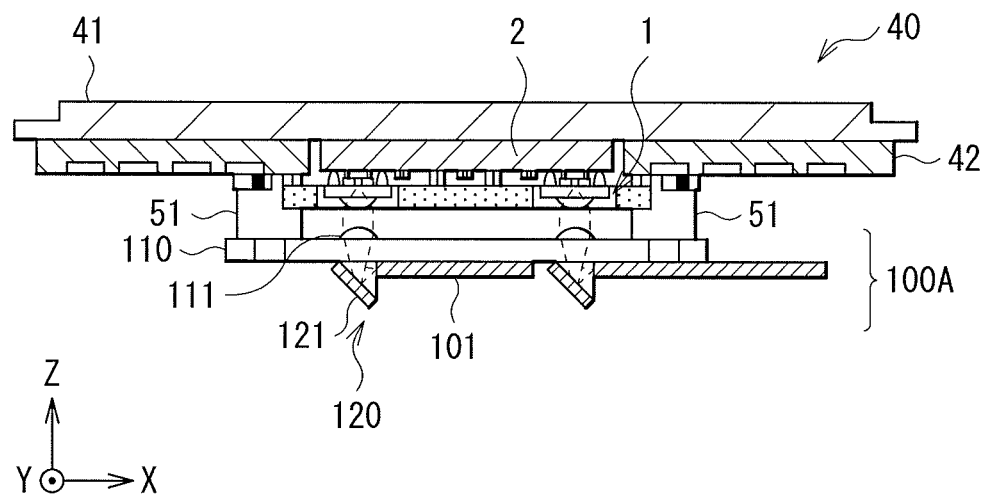

[ FIG. 29 ]
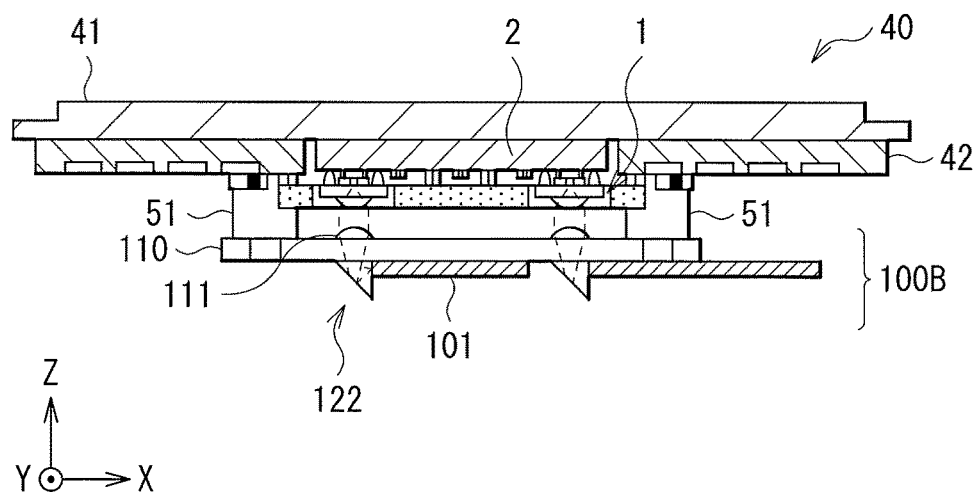
[ FIG. 30 ]
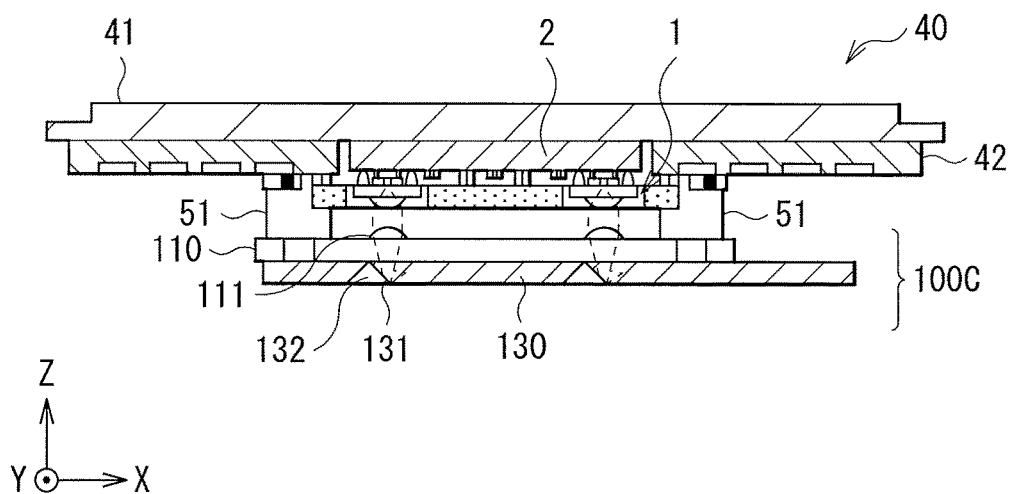

[ FIG. 31 ]
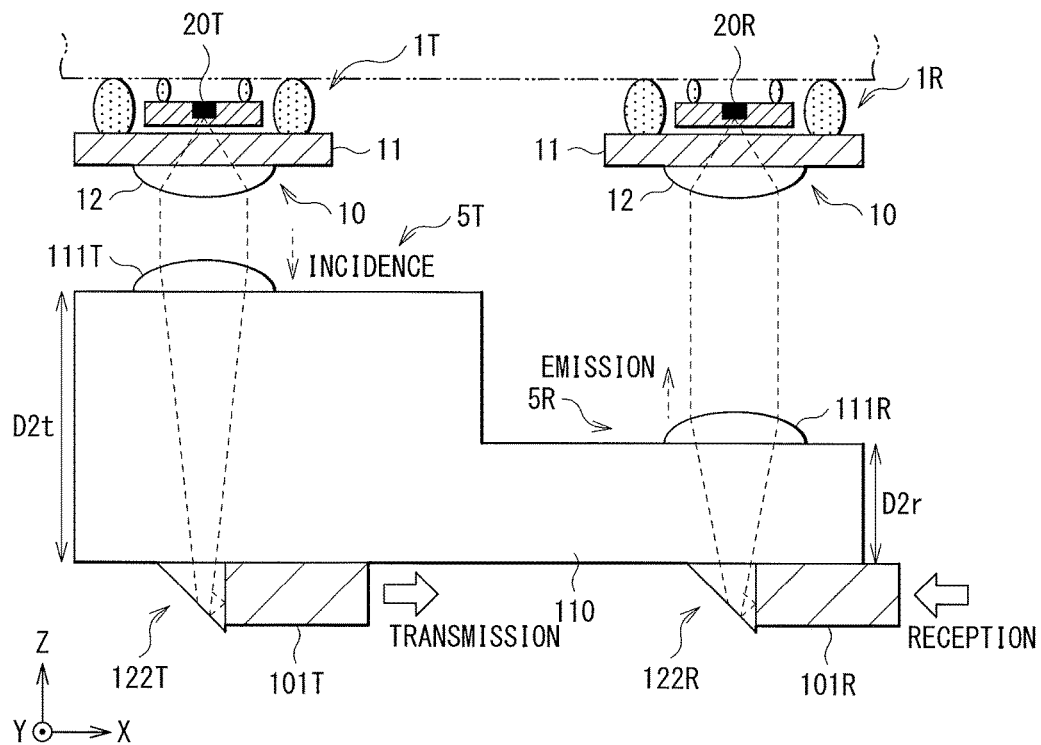
[ FIG. 32 ]
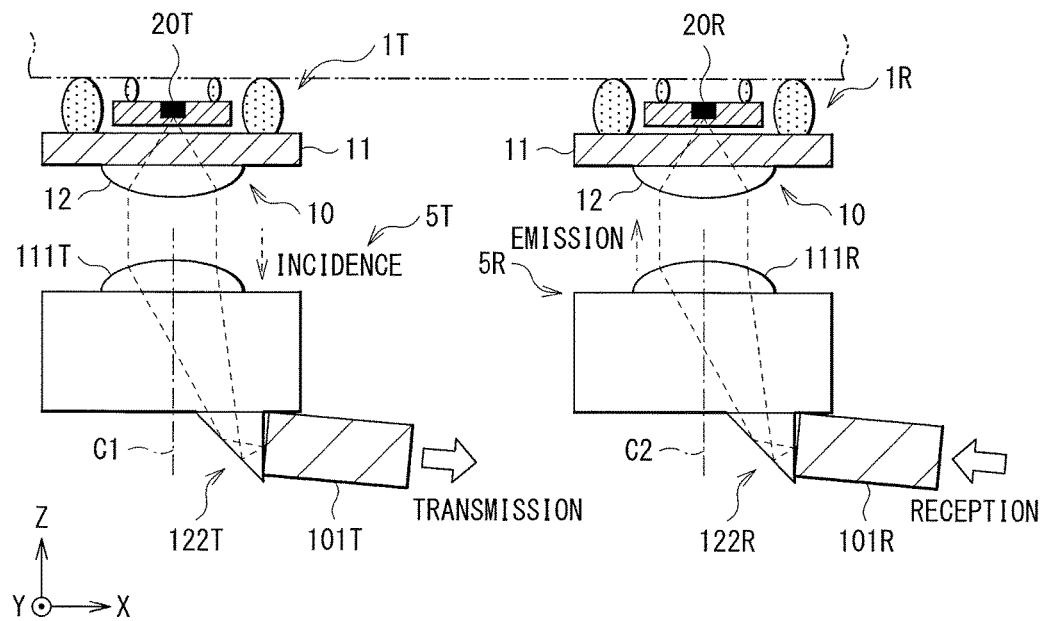

[ FIG. 33 ]
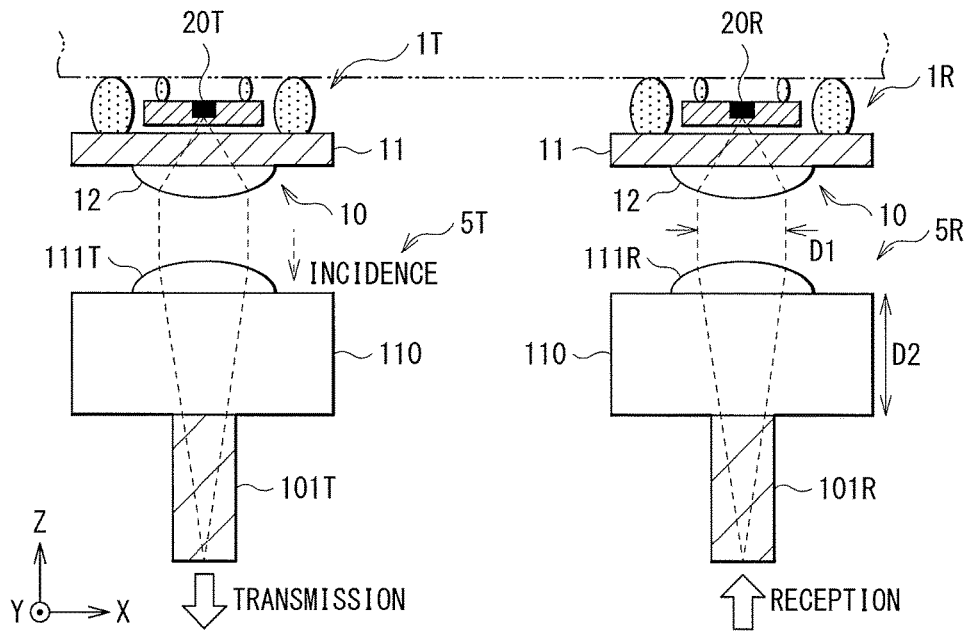
[ FIG. 34 ]
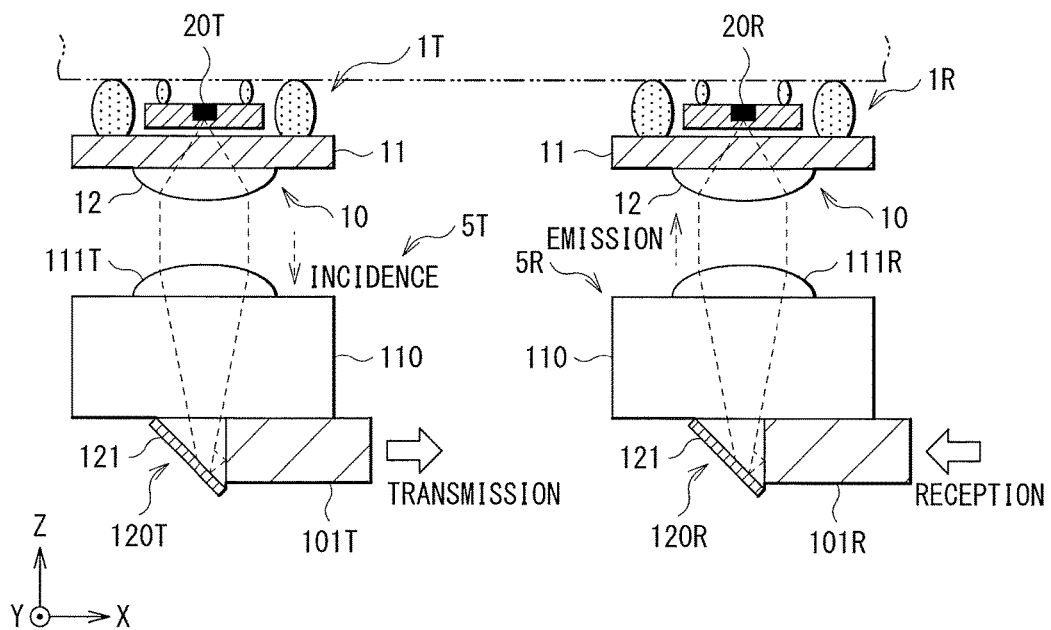

[ FIG. 35 ]
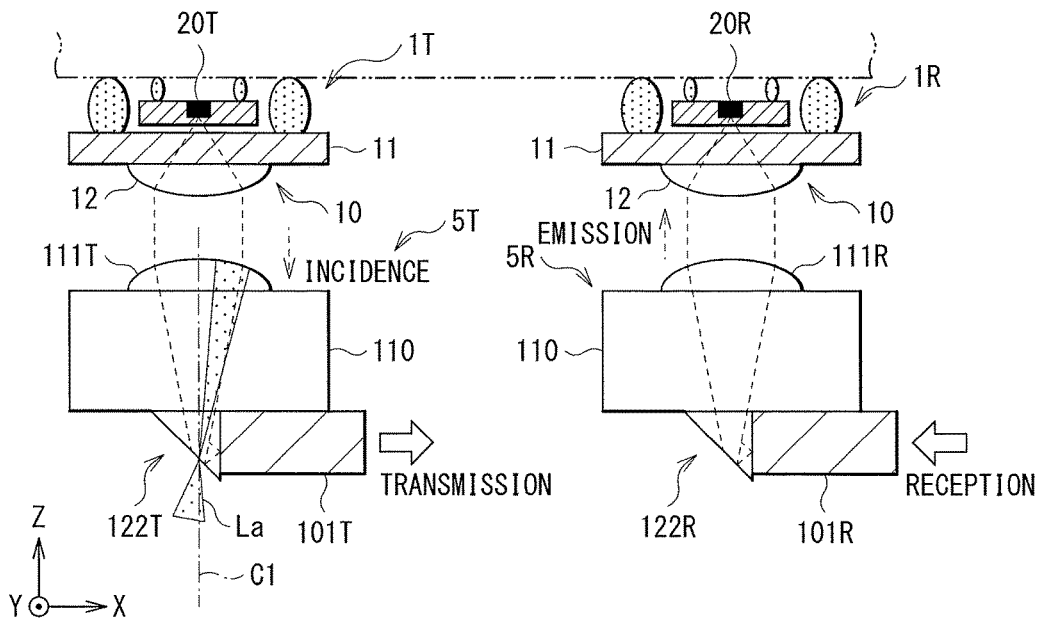
[ FIG. 36 ]
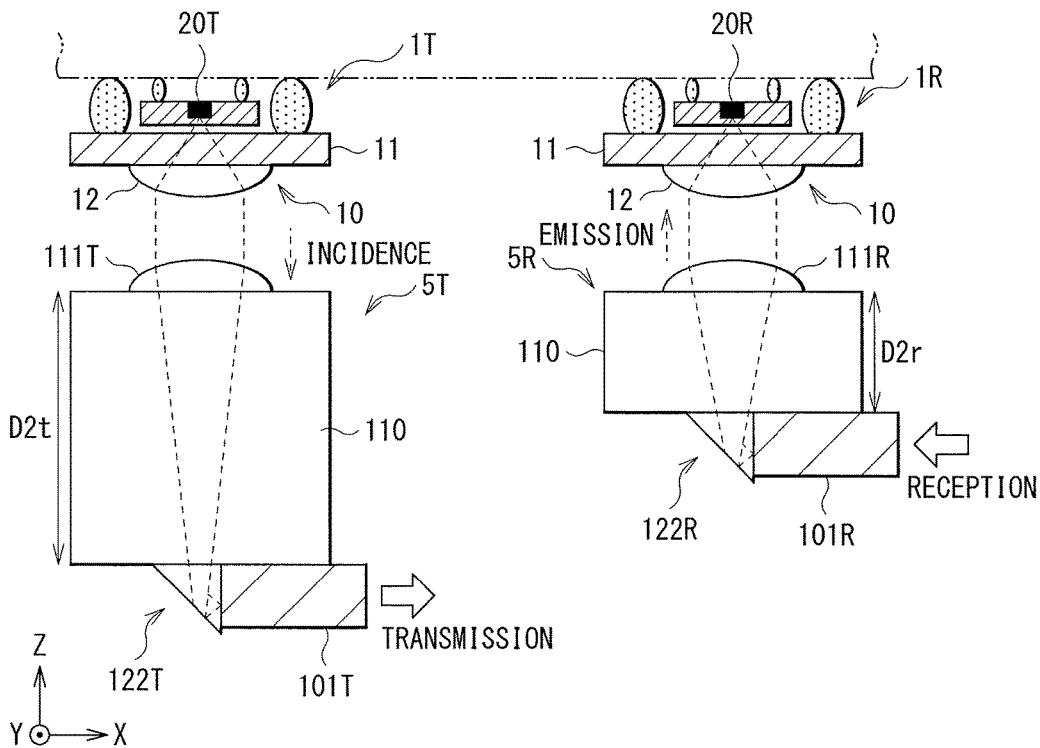

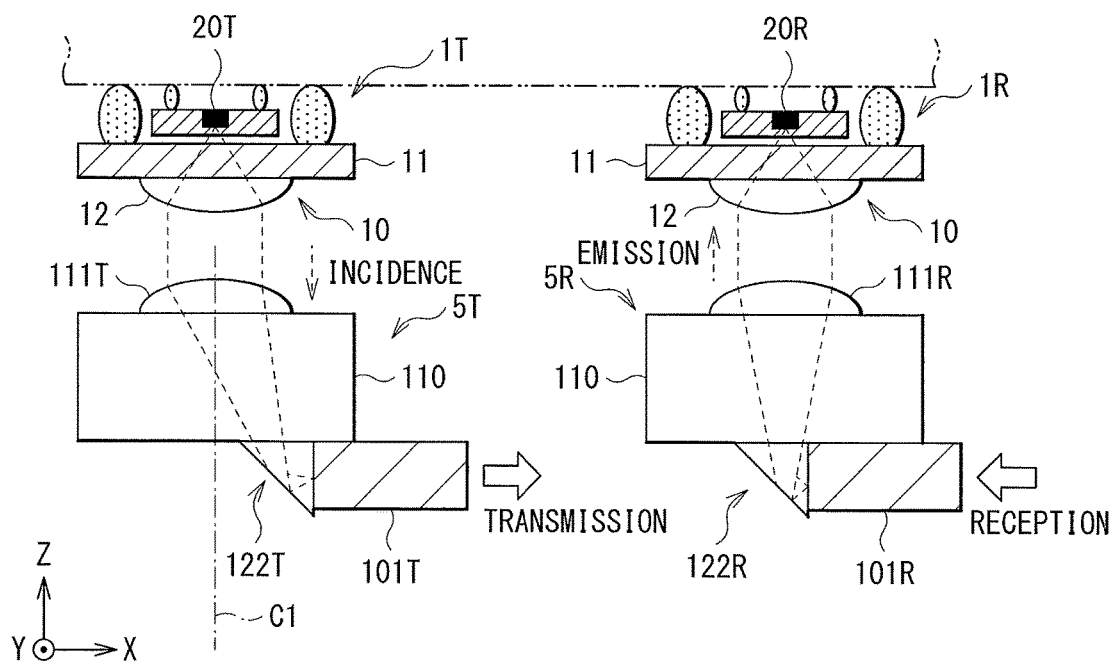
[ FIG. 37 ]

PHOTOELECTRIC MODULE AND OPTICAL DEVICE

CROSS-REFERENCE TO RELATED APPLICATIONS

The present application claims the benefit of International Application No. PCT/JP2015/062355, filed Apr. 23, 2015, which claims priority to Japanese Application No. 2014-099695, filed May 13, 2014, the entire contents of which are incorporated herein by reference.

TECHNICAL FIELD

The present disclosure relates to a photoelectric module and an optical device that are used for optical communication (optical transmission).

BACKGROUND ART

There is known optical communication technology in which an electrical signal is subjected to optical modulation and data is transmitted using light. As a photoelectric module for such optical transmission, there is known a configuration in which optical devices each configured of a combination of an optical function element such as a lens and a light emitting/receiving element (a light receiving element or a light emitting element) are optically coupled by an optical connector (for example, refer to Patent Literatures 1 to 4).

CITATION LIST

Patent Literature

Patent Literature 1: Japanese Unexamined Patent Application Publication No. 2001-185752
Patent Literature 2: Japanese Unexamined Patent Application Publication No. 2001-036197
Patent Literature 3: Japanese Unexamined Patent Application Publication No. 2012-137765
Patent Literature 4: Japanese Unexamined Patent Application Publication No. 2013-142732

Non-Patent Literature

Non-Patent Literature 1: Yehoshua Benjamin, Kobi Hasharoni, and Michael Mesh, "Assembly Development of 1.3 Tb/s Full Duplex Optical Module", Electronic Components and Technology Conference (ECTC), 2013, pp. 292-296

SUMMARY

In the photoelectric module mentioned above, the number of channels in the mounted optical devices increases in association with an increase in capacity. In order to cope with such an increase in the number of channels, it has been proposed to arrange optical devices in a two-dimensional layout as with, for example, technology described in Non-Patent Literature 1. It is necessary to provide an optical function element such as a lens for each of the channels in association with two-dimensional arrangement of the optical devices to enhance coupling efficiency with an optical connector. Moreover, the optical devices have low yield, and it is necessary to take measures against this.

It is therefore desirable to provide a photoelectric module and an optical device that make it possible to cope with an increase in the number of channels in optical transmission.

A photoelectric module according to an embodiment of the present disclosure includes an optical device including an optical function element array made of a first base material, and a plurality of light emitting/receiving elements made of a second base material, wherein the optical function element array includes an optical substrate and a plurality of optical function elements, the optical substrate having a first surface and a second surface, and the optical function elements being integrated with the optical substrate and being arranged one-dimensionally or two-dimensionally, and the light emitting/receiving elements and their respective optical function elements face each other with the optical substrate in between to be located on a same axis in a direction perpendicular to the optical substrate, and the light emitting/receiving elements are disposed on the second surface with a space in between while being separated in units of a smaller number than array number in the optical function element array.

An optical device according to an embodiment of the present disclosure includes: an optical function element array made of a first base material; and a plurality of light emitting/receiving elements made of a second base material, wherein the optical function element array includes an optical substrate and a plurality of optical function elements, the optical substrate having a first surface and a second surface, and the optical function elements being integrated with the optical substrate and being arranged one-dimensionally or two-dimensionally, and the light emitting/receiving elements and their respective optical function elements face each other with the optical substrate in between to be located on a same axis in a direction perpendicular to the optical substrate, and the light emitting/receiving elements are disposed on the second surface with a space in between while being separated in units of a smaller number than the array number in the optical function element array.

In the photoelectric module or the optical device according to the embodiment of the present disclosure, in the optical function element array, the plurality of the optical function elements are arranged one-dimensionally or two-dimensionally. Moreover, the plurality of light emitting/receiving elements are disposed on the second surface with a space in between while being separated in units of a smaller number than the array number in the optical function element array.

According to the photoelectric module or the optical device according to the embodiment of the present disclosure, the configuration of the optical device is optimized, which makes it possible to cope with an increase in the number of channels in optical transmission.

Note that effects described here are non-limiting. Effects achieved by the technology may be one or more of effects described in the present disclosure.

BRIEF DESCRIPTION OF DRAWINGS

FIG. 1 is a cross-sectional view of a configuration example of an optical device according to a first embodiment of the present disclosure.
FIG. 2 is another cross-sectional view of the configuration example of the optical device.
FIG. 3 is a cross-sectional view of another configuration example of the optical device.
FIG. 4 is another cross-sectional view of another configuration example of the optical device.

FIG. 5 is a plan view of a configuration example on first surface side of the optical device.

FIG. 6 is a plan view of a configuration example on second surface side of the optical device.

FIG. 7 is a plan view of an example in which a plurality of optical devices are arranged.

FIG. 8 is a cross-sectional view of a layout example of an FE circuit and the optical device.

FIG. 9 is a perspective view of a layout example of the FE circuit and the optical device.

FIG. 10 is a cross-sectional view of an example of an optimized layout of the FE circuit and the optical device.

FIG. 11 is a perspective view of an example of an optimized layout of the FE circuit and the optical device.

FIG. 12 is a plan view of a configuration example on first surface side of an optical device according to a first modification example of the first embodiment.

FIG. 13 is a plan view of a configuration example on second surface side of the first modification example of the first embodiment.

FIG. 14 is a plan view of a configuration example on second surface side of the optical device according to a second modification example of the first embodiment.

FIG. 15 is a cross-sectional view of a configuration example of a photoelectric module according to a second embodiment.

FIG. 16 is a cross-sectional view of a first process example of a process of manufacturing a photoelectric module.

FIG. 17 is a cross-sectional view and a plan view of a second process example of the process of manufacturing the photoelectric module.

FIG. 18 is a cross-sectional view and a plan view of a third process example of the process of manufacturing the photoelectric module.

FIG. 19 is a cross-sectional view and a plan view of a fourth process example of the process of manufacturing the photoelectric module.

FIG. 20 is a cross-sectional view of a course of mounting the photoelectric module on a mother board.

FIG. 21 is a cross-sectional view of a state in which the photoelectric module is mounted on the mother board.

FIG. 22 is a cross-sectional view of a state in which a cooling module is mounted on the photoelectric module and an example of an optical connector module that is optically coupled to the photoelectric module.

FIG. 23 is a cross-sectional view of a configuration example of a photoelectric module according to a third embodiment.

FIG. 24 is a cross-sectional view of a configuration example of a photoelectric module according to a fourth embodiment.

FIG. 25 is a cross-sectional view of another configuration example of the photoelectric module according to the fourth embodiment.

FIG. 26 is a cross-sectional view of a process of optically coupling an optical connector module having a first configuration example to the photoelectric module.

FIG. 27 is a cross-sectional view of the first configuration example of the optical connector module that is optically coupled to the photoelectric module.

FIG. 28 is a cross-sectional view of a second configuration example of the optical connector module that is optically coupled to the photoelectric module.

FIG. 29 is a cross-sectional view of a third configuration example of the optical connector module that is optically coupled to the photoelectric module.

FIG. 30 is a cross-sectional view of a fourth configuration example of the optical connector module that is optically coupled to the photoelectric module.

FIG. 31 is a cross-sectional view of a first example of optimization of the optical connector module.

FIG. 32 is a cross-sectional view of a second example of optimization of the optical connector module.

FIG. 33 is a cross-sectional view of a configuration example of a vertical extraction type optical connector module.

FIG. 34 is a cross-sectional view of a configuration example of a horizontal extraction type optical connector module using a reflective mirror.

FIG. 35 is a cross-sectional view of a configuration example of a horizontal extraction type optical connector module using a total reflection mirror.

FIG. 36 is a cross-sectional view of another configuration example of the horizontal extraction type optical connector module using the total reflection mirror.

FIG. 37 is a cross-sectional view of a configuration example of an optimized horizontal extraction type optical connector module using a total reflection mirror.

EMBODIMENTS FOR CARRYING OUT THE INVENTION

In the following, some embodiments of the present disclosure are described in detail with reference to the drawings. It is to be noted that description is given in the following order.
<0. Photoelectric Module Including Two-dimensionally Arranged Optical devices>
 [0.1 Issues]
<1. First Embodiment> (Configuration Example of Optical device) (FIGS. 1 to 14)
 [1.1 Configuration Example of Optical device]
 [1.2 Workings and Effects]
 [1.3 Modification Examples]
<2. Second Embodiment> (First Example of Photoelectric Module) (FIGS. 15 to 22)
 [2.1 Configuration Example]
 [2.2 Manufacturing Process]
 [2.3 Workings and Effects]
<3. Third Embodiment> (Second Example of Photoelectric Module) (FIG. 23)
 [3.1 Configuration Example]
 [3.2 Workings and Effects]
<4. Fourth Embodiment> (Third Example of Photoelectric Module) (FIGS. 24 and 25)
 [4.1 Configuration Example]
 [4.2 Workings and Effects]
<5. Fifth Embodiment> (Optimization of Optical Connector) (FIGS. 26 to 37)
 [5.1 Configuration Examples of Optical Connector Module]
 [5.2 Optimization of Optical Connector Module]
 (Configuration Example of Optimized Optical Connector Module)
 (Optical Design Example without Using Total Reflection Mirror)
 (Optical Design Example Using Total Reflection Mirror)
 [5.3 Workings and Effects]
<6. Other Embodiments>

0. Photoelectric Module Including Two-Dimensionally Arranged Optical Devices

[0.1 Issues]
In the following, description is given of issues in a photoelectric module in which optical devices having an optical function such as a lens for respective channels are two-dimensionally arranged. It is to be noted that, as a photoelectric module in which the optical devices are two-dimensionally arranged, there is known a configuration in which a light emitting/receiving element array including a plurality of light emitting/receiving elements (light receiving elements or light emitting elements) is integrated with an optical function element array including a plurality of optical function elements such as lenses that are two-dimensionally arranged, and the light emitting/receiving elements (light receiving elements or light emitting elements) are two-dimensionally arranged corresponding to the optical function elements. In this case, there is known a configuration in which array number in the light receiving/emitting element array is equal to array number in the optical function element array.

(Issue 1)

It is necessary to further reduce optical coupling loss in association with an increase in transmission rate.

Approaches toward enhancement of speed of the photoelectric module include, together with an increase in the number of channels, four-level transmission (4PAM) and an improvement in transmission rate. It is confirmed from a simulation of loss necessary for an optical connector connecting a transmission-side circuit and a reception-side circuit to each other on the basis of requirements of these circuits that, for example, a loss amount of 3.7 dB or less may be necessary in the four-level transmission, and, for example, a loss amount of 6.0 dB or less may be necessary at a transmission rate of 25 Gbps.

(Issue 2)

In order to enhance coupling efficiency with the optical connector, it is necessary to provide an optical function element having a largest possible area for each channel.

When misalignment occurs between the optical device and the optical connector, optical coupling loss increases. In order to minimize such an influence, it is necessary to provide a light-condensing function element with a largest possible aperture. To give an example, in a case in which vertical and horizontal pitches of the optical device are 250 μm in conformity with fiber standards, for example, a lens diameter of 43240 μm and a largest possible aperture may be demanded.

(Issue 3)

In order to suppress variation in entire optical coupling efficiency between two-dimensionally arranged optical devices and the optical connector, it is necessary to reduce a total coupling area.

Moreover, as with the foregoing issue 2, in order to enhance optical coupling efficiency in all channels, it is effective to reduce an area of an optical coupling region between the optical devices and the optical connector. Accordingly, for example, a configuration using an integration type optical device having 12×14 channels has been proposed as the optical device. When the optical device is separated into elements, it is necessary to provide a certain clearance for mounting of the respective elements. The clearance may be, for example, 200 μm, which is close to a width of one channel for the element. Therefore, in related art, there is an issue that it is difficult to increase the element number of light emitting elements and light receiving elements in order to reduce an entire coupling area.

(Issue 4)

A configuration less influenced by light emitting/receiving elements having low yield is necessary.

Yield of an optical device coping with a transmission rate of higher than 10 Gbps, in particular, a VCSEL (a surface emitting laser) is low, which is about 90% or less. For example, in a case in which the optical devices arrayed into a 100-channel array, few conforming optical device arrays having an integrated configuration may be obtained (for example, 0.1% or less). Moreover, when the transmission rate is, for example, 25 Gbps, yield of the VCSEL coping with the transmission rate may be very low, that is, for example, 60% or less. Hence, a configuration using the integrally arrayed optical devices becomes impractical in the future.

(Issue 5)

In association with a higher rate and higher integration, it is necessary to arrange transmission-side (light emission-side) elements and reception-side (light reception-side) elements in a mixed fashion while keeping an element pitch.

In a next-generation high-performance I/F (interface), transmission-side elements (Tx) and reception-side elements (Rx) are mixed at high density. For example, the transmission-side elements and the reception-side elements may be alternately arranged in order of Tx, Rx, Tx, and Rx, or a unit of four transmission-side elements and a unit of four reception-side elements may be alternately arranged in order of TxTxTxTx and RxRxRxRx. In other words, a related-art configuration in which the transmission-side elements (Tx) and the reception-side elements (Rx) are separately arrayed as mentioned above is impractical.

(Other Issues)

In addition to the foregoing issues, a photoelectric module in related art has the following issues.

1. In an ultra-large capacity photoelectric transmission board, in order to enhance heat dissipation, it is necessary to bond an IC (an integrated circuit) and a LID substrate together. However, the LID is also adhered to an IP (interposer) substrate at the same time, and a biased stress caused between the IC and IP substrate causes a stress to be focused on a weakest region around a hole of the IP substrate, thereby breaking the IP substrate.

2. It is necessary to enhance positioning accuracy of the optical connector.

The optical device and the optical connector each have a misalignment margin of a several tens of μm by a collimated coupling optical system. However, in a case of a tera-order transmission capacity, the number of channels is as enormous as about 100. Therefore, an area to be subjected to collimation coupling increases as well. In positioning on an organic substrate under present circumstances, accuracy and stability are insufficient.

3. In a configuration in which an electrical signal is transmitted between the optical device and a mother board, it is necessary to pass the electrical signal from a front surface of the IP substrate to a rear surface thereof at high speed. At this occasion, it is necessary for the electrical signal to pass through a through via that is difficult to match impedance; however, a stub present in each layer degrades the signal.

4. It is necessary to provide a large number of optical devices having low yield, which causes difficulty in securing yield as a photoelectric package (yield of the optical device is lower than yield of, for example, any other silicon IC).

In the following, description is given of embodiments of an optical device and a photoelectric module for solving of the foregoing issues.

1. First Embodiment

[1.1 Configuration Example of Optical Device]

FIG. 1 illustrates a cross-sectional configuration example of an optical device 1 according to a first embodiment of the present disclosure. FIG. 2 illustrates a configuration example of another cross-section of the optical device 1 illustrated in FIG. 1. Moreover, FIGS. 3 and 4 each illustrate another configuration example of the optical device 1. FIGS. 5 and 6 each illustrate a planar configuration example of the optical device 1.

It is to be noted that in FIG. 1, a direction perpendicular to a lens substrate 11 of the optical device 1 denotes a Z-axis direction, directions perpendicular to each other in a plane parallel to a substrate surface of the lens substrate 11 denote an X-axis direction and a Y-axis direction. The same applies to other drawings.

The optical device 1 includes an optical function element array (lens array) 10 made of a first base material and a plurality of light emitting/receiving elements (light emitting elements or light receiving elements) 20 made of a second base material that is different from the first base material. The optical function element array 10 includes an optical substrate (a lens substrate 11) having a first surface and a second surface, and a plurality of optical function elements (lenses 12) that are integrated with the lens substrate 11 and are one-dimensionally or two-dimensionally arranged on the first substrate. Herein, the first surface may be, for example, an upper surface of the lens substrate 11 in the example in FIG. 1, and the second surface may be, for example, a lower surface of the lens substrate 11 in the example in FIG. 1. A wiring layer 13 (FIGS. 1 and 2) or a wiring layer 14 (FIGS. 3 and 4) is formed on the second surface side of the lens substrate 11.

In the optical device 1, the light emitting/receiving elements 20 and their respective lenses 12 face each other with the lens substrate 11 in between so as to be located on a same axis in a direction perpendicular to the lens substrate 11. Moreover, the light emitting/receiving elements 20 are disposed on the second surface with a space in between while being separated in units of a smaller number than array number in the optical function element array 10.

Herein, in each of the configuration examples illustrated in FIGS. 2, 4, 5, and 6, the optical device 1 having four-channel configuration is illustrated. In each of the configuration examples, four lenses 12 for four channels are arranged in one line, and are formed integrally with the lens substrate 11. In other words, the array number of the lenses 12 in the optical function element array 10 is four. In contrast, four light emitting/receiving elements 20 are provided as a whole; however, the light emitting/receiving elements 20 are separated from one another in the configuration. In other words, the light emitting/receiving elements 20 are separated in units of one.

The optical device 1 also includes a solder bump 31 (a first solder bump) and a solder bump 32 (a second solder bump). The solder bump 31 is in contact with the second surface of the lens substrate 11 and is electrically connected to the lens substrate 11. The solder bump 32 is provided for and electrically connected to each of the plurality of light emitting/receiving elements 20.

The solder bump 31 is electrically connected to the lens substrate 11 through the wiring layer 13 (FIGS. 1 and 2) or the wiring layer 14 (FIGS. 3 and 4). The lens substrate 11 is mounted on a base substrate 30 with the solder bump 31 in between. The base substrate 30 may be, for example, a substrate such as an IP substrate (an interposer substrate), or an FEIC including a FE (front-end) circuit that drives the light emitting/receiving elements 20.

Herein, FIGS. 1 and 2 each illustrate a configuration example in which the light emitting/receiving elements 20 are attached to the second surface of the lens substrate 11 by the solder bumps 32. FIGS. 3 and 4 each illustrate a configuration example in which the light emitting/receiving elements 20 are attached to the base substrate 30 by the solder bumps 32.

[1.2 Workings and Effects]

According to the present embodiment, the configuration of the optical device 1 is optimized, which makes it possible to cope with an increase in the number of channels in optical transmission.

Note that the effects described in the present specification are illustrative and non-limiting. Effects achieved by the technology may be effects other than those described above. This applies to the following embodiments.

FIG. 7 illustrates an example in which a plurality of optical devices 1 are disposed on the base substrate 30. A bypass condenser 22 may be provided for each channel between adjacent two of the plurality of optical devices 1. In the present embodiment, an array in one optical device 1 has two columns or less; which makes it possible to provide the bypass condenser 22 for each channel. At this occasion, the bypass condenser 22 may be of not only an illustrated surface-mounting type but also a substrate-embedded type or any other mode.

(About Base Material of Optical Device 1)

In the present embodiment, the optical function element array 10 and the light emitting/receiving element 20 are made of different base materials. In related art, as a transmission light wavelength, for example, light of about 1000 nm (for example, 985 nm) may be adopted. Since the light in this band passes through a substrate of a compound such as a GaAs substrate, the light in this band is adopted. In other words, when the optical device has a backside emission and backside reception configuration, and a rear surface of a substrate is processed into a lens shape by, for example, dry etching, it is possible to condense light inputted to and outputted from the rear surface, thereby reducing loss. In related art, for such a merit, the light emitting/receiving element and the optical function element (lens) are made of a same base material. In other words, a configuration in which a substrate of the light emitting/receiving element also serves as the optical function element is adopted. However, such a configuration has a demerit. A small number of 985-nm light sources are mass-produced, which causes the 985-nm light sources to be expensive. Accordingly, the present embodiment adopts a light source of 850 nm that is produced in large volume and is inexpensive. Light of an 850-nm band does not pass through a compound substrate such as GaAs, but passes through, for example, glass, quartz, sapphire, and a transparent resin. Hence, for example, glass, quartz, sapphire, and a transparent resin may be preferably adopted for the optical function element array 10.

(Positional Relationship Between Light Emitting/Receiving Element 20 and Lens 12)

In the present embodiment, the light emitting/receiving elements 20 and their respective lenses 12 face each other with the lens substrate 11 in between so as to be located on the same axis in the direction perpendicular to the lens substrate 11.

Herein, as a merit of a configuration in which the light emitting/receiving elements 20 are attached to the lens substrate 11 by the solder bumps 32 as illustrated in FIGS. 1 and 2, the optical device 1 is mounted directly on the optical function element array 10, which makes it possible to align the positions of the light emitting/receiving elements 20 and the lenses 12 at high accuracy on the basis of both electrode pads of the light emitting/receiving elements 20 and the lenses 12. In other words, use of a self-alignment effect of the solder bumps 32 may make it possible to reduce variations in both the positions to ±10 μm or less, for example. The self-alignment effect of the solder bumps 32 is achieved by performing alignment between a pad of the light emitting/receiving elements 20 and a pad of the optical function element array 10 with use of surface tension of melted solder. As a material of the solder bumps 32 in this case, a material that is melted by a typical reflow apparatus and allows for execution of self-alignment with use of high surface tension of solder generated by melting of the solder may be preferably adopted. Examples of the material may include Sn, a Sn—Ag-based material, a Sn—Ag—Cu-based material, and a Sn—Bi-based material. A bump that allows for bonding by ultrasonic vibration such as a Au—Au bump and other similar bumps are not included.

In contrast, in a case with the configuration illustrated in FIGS. 1 and 2, a wiring length from the light emitting/receiving element 20 to the base substrate 30 is increased. The solder bump 31 having a large diameter is present in a wiring path between the light emitting/receiving element 20 and the base substrate 30, which causes a large wiring capacity and difficulty in transmitting a high-speed signal. For example, there may be a disadvantage that a waveform is easily degraded at a transmission rate (band) exceeding 10 Gbps. As with the configuration example illustrated in FIGS. 3 and 4, a configuration in which the light emitting/receiving element 20 and the lens substrate 11 are separately mounded on the base substrate may be adopted to take measures against the disadvantage. Adoption of this configuration makes it possible to reduce the wiring length between the light emitting/receiving element 20 and the base substrate 30, and remove the solder bump 31 having a large diameter from the path, thereby leading to an improvement in high-speed transmission characteristics as a merit. For example, when the transmission rate exceeds 16 Gbps, there is a possibility that change to this configuration is necessary. As a demerit of this configuration, the optical function element array 10 and the light emitting/receiving element 20 respectively perform self-alignment with respect to the base substrate 30 by the solder bumps 31 and 32. In other words, there is a possibility that variations in their positions are exacerbated to ±20 μm that is twice as large as that in the configuration example illustrated in FIGS. 1 and 2.

(About Positional Relationship Between Optical Device 1 and Front End Circuit)

In the following, description is given of a positional relationship in a case in which the optical device 1 according to the present embodiment as a photoelectric module is combined with FE circuits that drive the light emitting/receiving elements 20.

For example, an IP substrate 200 and FE circuits 301 may be included as a photoelectric module as illustrated in FIGS. 8 and 9 or FIGS. 10 and 11, and it is possible to connect the light emitting/receiving elements 20 and the FE circuits 301 to each other through the IP substrate 200. For example, the FE circuits 301 may each be a TIA (transimpedance amplifier) in a case in which the light emitting/receiving element 20 is a light receiving element (PD (photodiode)), and an LDD (laser diode driver) in a case in which the light emitting/receiving element 20 is a light emitting element (VCSEL).

The IP substrate 200 and the FE circuits 301 are electrically connected to each other through bumps 211. In a configuration example in FIGS. 8 and 9, a plurality of wiring lines 201 and 202 with different wiring lengths are used as respective wiring lines for connection of the plurality of light emitting/receiving elements 20 to the FE circuits 301. In a configuration example in FIGS. 10 and 11, wiring lines 203 with a substantially equal wiring length are used for connection of the plurality of light emitting/receiving elements 20 to the FE circuits 301.

The wiring lengths from the light emitting/receiving elements 20 to their respective FE circuits 301 may be preferably substantially equal as with the configuration example in FIGS. 10 and 11.

It is necessary to connect the FE circuits 301 to the light emitting/receiving elements 20 with wiring lines with an substantially equal length in order to prevent a skew of electrical transmission (a transmission time difference). When the transmission rate is as high as, for example, 10 Gbps, even a slight difference in the wiring length may adversely affect characteristics of a photoelectric package. Therefore, for example, connection as with the configuration example in FIGS. 8 and 9 may not be preferable.

Hence, channels of the FE circuits 301 and channels of the light emitting/receiving elements 20 may be preferably connected to each other at an equal length with the IP substrate 200 in between through, for example, through vias, as with the configuration example in FIGS. 10 and 11. Accordingly, the channels of the FE circuits 301 and the channels of the light emitting/receiving elements 20 may be preferably arranged with equal vertical and horizontal pitches. In other words, the plurality of light emitting/receiving elements 20 and the FE circuits 301 may be preferably in same positional relationship in a direction perpendicular to the substrate. It is to be noted that the same applies to a configuration without the IP substrate 200 or a case in which the light emitting/receiving elements 20 and the FE circuits 301 are connected to each other without the IP substrate 200.

[1.4 Modification Examples]

In the above description, in the optical function element array 10, the configuration in which the lenses 12 are arranged in one line is illustrated; however, for example, a configuration in which the lenses 12 and the light emitting/receiving elements 20 are arranged in two or more lines, i.e., two-dimensionally arranged as a whole may be adopted, as illustrated in FIGS. 12 and 13.

Moreover, in the above description, the configuration in which the light emitting/receiving elements are separated in units of one is illustrated; however, an array configuration in which two or more of the light emitting/receiving elements 20 are integrated may be adopted, as long as the number of the light emitting/receiving elements 20 that are integrated is smaller than the array number in the optical function element array 10. For example, an array configuration in which two light emitting/receiving elements 20 are integrated may be adopted as illustrated in FIG. 14. In a case with the configuration in FIG. 14, the array number in the optical function element array 10 is four, and the array number of the light emitting/receiving elements 20 is two.

<2. Second Embodiment> (First Example of Photoelectric Module)

In the following, description is given of a photoelectric module according to a second embodiment of the present disclosure. It is to be noted that substantially same components as the components of the foregoing first embodiment are denoted by same reference numerals, and any redundant description thereof is omitted.

[2.1 Configuration Example]

FIG. 15 illustrates a configuration example of a photoelectric module 40 according to a second embodiment of the present disclosure. FIG. 16 illustrates a first process example of a process of manufacturing the photoelectric module 40. FIG. 17 is a cross-sectional view and a plan view of a second process example of the process of manufacturing the photoelectric module 40. FIG. 18 is a cross-sectional view and a plan view of a third process example of the process of the manufacturing the photoelectric module 40. FIG. 19 is a cross-sectional view and a plan view of a fourth process example of the process of manufacturing the photoelectric module 40. FIG. 20 illustrates a course of mounting the photoelectric module 40 on a mother board 4. FIG. 21 illustrates a state in which the photoelectric module is mounted on the mother board 4. FIG. 22 illustrates a state in which a cooling module 56 is mounted on the photoelectric module 40 and an example of an optical connector module 100 that is optically coupled to the photoelectric module 40.

The photoelectric module 40 according to the present embodiment includes an FEIC 2 and an IP substrate. The FEIC 2 has one surface on which the optical devices 1 are mounted. The FEIC 2 and the optical devices 1 are mounted on the IP substrate, and the IP substrate electrically connects the FEIC 2 to the mother board 4. The IP substrate includes a first substrate 41, a second substrate 42, and a third substrate 43. The photoelectric module 40 further includes a positioning member (a dowel pin 51) for mounting of the optical connector module 100 (FIG. 22).

The optical device 1 may have a similar configuration to that in the foregoing first embodiment. A plurality of optical devices 1 may be two-dimensionally arranged. The FEIC 2 may include a drive circuit that drives the light emitting/receiving element 20 of the optical device 1. For example, a TIA (transimpedance amplifier) may be included in a case in which the light emitting/receiving element 20 of the optical device 1 is a light receiving element (PD), and an LDD (laser diode driver) may be included in a case in which the light emitting/receiving element 20 of the optical device 1 is a light emitting element (VCSEL).

The first substrate 41 is bonded to the other surface of the FEIC 2 by a bonding material such as silver paste. The second substrate 42 has a role as a first bonding substrate, and is bonded to the first substrate 41 through a bonding section 44. The second substrate 42 has an opening (IC-mounting opening) 46 for mounting of the FEIC 2 on the first substrate 41. The third substrate 43 has a role as a second bonding substrate, and is disposed between the FEIC 2 and the mother board 4 without contacting the mother board 4. The third substrate 43 has an opening (light input/output opening) 52 for optical transmission that is to be performed by the optical device 1.

The first substrate 41 has a role as a reinforcing substrate and a heat dissipating substrate, and has high heat dissipation and high rigidity. The first substrate 41 may be, for example, a LID substrate. A temperature of the first substrate 41 may be controlled by an external cooling medium. For example, a cooling module 56 as a cooling medium may be disposed on a substrate surface opposite to side where the FEIC 2 is mounted of the first substrate 41 with a bonding material 57 in between, as illustrated in FIG. 22. An end surface of the dowel pin 51, the other surface of the FEIC 2, and one substrate surface of the second substrate 42 may be preferably bonded to one substrate surface of the first substrate 41 as a whole without space.

The second substrate 42 has a connection configuration in which the second substrate 42 is electrically connected to the FEIC 2 through the third substrate 43 and electrically connects the third substrate 43 and the mother board 4 to each other. The third substrate 43 has a connection configuration in which the third substrate 43 electrically connects the FEIC 2 and the second substrate 42 to each other. For such electrical connection, the FEIC 2 and the third substrate 43 are connected to each other through a solder bump 33. Moreover, the second substrate 42 and the third substrate 43 are connected to each other through the solder bump 33. Further, a wiring layer 53 for electrical connection is provided in the second substrate 42. The wiring layer 53 is provided around a substrate surface without penetrating through the second substrate 42. Thus, electrical connection between the FEIC 2 and the mother board 4 is established through the second substrate 42 and a surface section of the third substrate 43 without penetration through the second substrate 42 and the third substrate 43.

[2.2 Manufacturing Process]

Description is given of a process of manufacturing the photoelectric module 40 with reference to FIGS. 16 to 22.

First, the optical devices 1 and passive elements (passive elements 3) are mounted on the FEIC 2 in a wafer level, as illustrated in FIG. 16. Thereafter, a wafer is diced into chips. It is to be noted that the optical device 1 may be mounted on the FEIC 2 through a holding substrate 80 as with a configuration in FIG. 24 according to an embodiment to be described later.

Next, as illustrated in FIG. 17, the second substrate 42 is aligned to and adhered to the first substrate 41, and the FEIC 2 is aligned to and adhered to the first substrate 41 through an opening 54 provided in the second substrate 42. Subsequently, the dowel pin 51 is engaged into and adhered to a positioning hole 55 of the first substrate 41, as illustrated in FIG. 18. It is to be noted that the dowel pin 51 may be adhered first. Alternatively, the dowel pin 51 may be adhered and fixed without providing the positioning hole 55. Further, the dowel pin 51 may be adhered on the second substrate 42.

Next, the third substrate 43 and the passive element 58 are mounted as illustrated in FIG. 19.

Subsequently, the photoelectric module 20 manufactured in the above-described manner is mounted on the mother board 4 as illustrated in FIGS. 20 and 21. The mother board 4 is provided with a mounting section 61 and an opening 62. An end of the second substrate 42 is mounted in contact with the mounting section 61 of the mother board 4. The third substrate 43 is located at the opening 62 of the mother board 4, and is configured not to directly contact the mother board 4. Moreover, the second substrate 42 may be directly mounted on the mother board 4.

Next, the cooling module 56 is mounted on the first substrate 41 of the photoelectric module 40 with the bonding material 57 in between as illustrated in FIG. 22. Moreover, the optical connector module 100 is connected to the photoelectric module 40 through the dowel pin 51.

[2.3 Workings and Effects]

According to the photoelectric module 40 of the present embodiment, the following workings and effects are achievable.

(Relation to High-Speed Optical Transmission)

Surface adhesion of the FEIC 2 and the second substrate 42 to the first substrate 41 increases apparent rigidity of the FEIC 2 and the IP substrate. Accordingly, even though the second substrate 42 is mounted on the mother board 4, the second substrate 42 is resistant to deformation. Even if deformation occurs, it is possible for the second substrate 42 only to absorb a stress caused by distortion. Moreover, the FEIC 2 and the second substrate 42 are adhered to the first substrate 41 to be integrated. This makes it possible to suppress change in positional relationship between the FEIC 2 and the second substrate 42.

The FEIC 2 and the second substrate 42 are connected to each other by the independent third substrate 43. The third substrate 43 connects only the FEIC 2 and the second substrate 42 that are firmly fixed to the first substrate 41 to each other, and does not contact other members such as the mother board 4. Accordingly, even if the third substrate 43 has the opening 52 for optical signal extraction, a biased stress is hardly applied to the solder bump 33 of the FEIC 2.

(Relation to Positioning for Optical Coupling)

The dowel pin 51 for the optical connector module 100 is provided on the first substrate 41. For example, making the first substrate 41 of metal makes it possible to dispose a pin at high position accuracy. Providing the dowel pin 51 on the first substrate 41 having high rigidity increases rigidity of the dowel pin 51 and resistance of the dowel pin 51 to deformation. Moreover, even if a biased stress is applied to the dowel pin 51, mounting of the optical connector module 100 causes the biased force to be less likely to be exerted on the second substrate 42 and the third substrate 43 where the solder bump 33 and other components that are sensitive to an external force are formed.

Moreover, in a case in which the dowel pin 51 is disposed directly on the first substrate 41 having high heat dissipation, a temperature of the dowel pin 51 is also efficiently controlled. Accordingly, heat of the FEIC 2 is less likely to be conducted to the optical connector module 100 through a member between the FEIC 2 and the optical connector module 100. Moreover, there is a possibility that the heat of the FEIC 2 is conducted to the optical connector module 100 through space; however, air has extremely low thermal conductivity, and the third substrate 43 disposed therebetween has an effect of blocking radiant heat. Accordingly, the configuration of the present embodiment largely suppresses deformation of the optical connector module 100 caused by temperature.

(Relation to High-Speed Electrical Transmission)

In a configuration in related art, it is necessary to pass an electrical signal from a front surface of the IP substrate to a rear surface thereof. In contrast, it is necessary for the IP substrate to supply large electric power to the FEIC 2, and, therefore, many power source layers exist. It is therefore necessary to provide a through via in the layers to pass an electrical high-speed signal therethrough; however, the through via is difficult to match impedance, and many stubs present in the respective layers cause a difficulty in that the high-speed signal passes through the through via.

In contrast, in the configuration of the present embodiment, it is not necessary to pass the electrical signal from the front surface of the IP substrate to the rear surface thereof. Only the second substrate 42 and wiring in the surface section of the third substrate 43 make it possible to guide the signal from the FEIC 2 to the mother board 4. This makes it possible to keep high signal quality. Moreover, the number of vias in a high-speed electrical transmission path is reduced to facilitate impedance matching, thereby facilitating wiring design. Further, it is possible to provide the third substrate 43 with a capacitor function for stabilization of a power source.

<3. Third Embodiment> (Second Example of Photoelectric Module)

In the following, description is given of a photoelectric module according to a third embodiment of the present disclosure. It is to be noted that substantially same components as the components of the foregoing first and second embodiments are denoted by same reference numerals, and any redundant description thereof is omitted.

[3.1 Configuration Example]

FIG. 23 illustrates a configuration example of the photoelectric module according to the present embodiment. The photoelectric module according to the present embodiment includes an IP substrate 72 (a multilayer substrate) with a multilayer configuration that electrically connects the optical device 1 and the FEIC 2 to each other. The IP substrate 72 has a depressed section 76 formed by reducing the number of substrate layers to be smaller than the number of substrate layers in a region other than the depressed section 76. The optical device 1 is so mounted on the IP substrate 72 as to be fit into the depressed section 76.

The optical device 1 may have a similar configuration to that in the foregoing first embodiment. A plurality of optical devices 1 may be two-dimensionally arranged. The FEIC 2 may include a drive circuit that drives the light emitting/receiving element 20 of the optical device 1.

The FEIC 2 is disposed in a processor 71. It is to be noted that the FEIC 2 may be mounted in the processor 71 as illustrated, or may be provided as one chip separately from the processor.

The IP substrate 72 has a wiring layer 82 with a multilayer configuration. The IP substrate 72 is electrically connected to the FEIC 2 and the processor 71 through solder bumps 81. A through via 83 for electrical connection between the optical device 1 and the FEIC 2 is provided in the depressed section 76 of the IP substrate 72. The IP substrate 72 is connected to the optical connector 73 through a dowel pin 75. A lens section 74 that is optically coupled to the lens 12 of the optical device 1 is provided in the optical connector 73.

[3.2 Workings and Effects]

According to the photoelectric module of the present embodiment, the following workings and effects are achievable.

A through hole (opening) for mounting of the optical device 1 is not provided in the IP substrate 72. This makes it possible to prevent an issue of concentration of a stress. Since the IP substrate 72 does not have a through hole, shape accuracy of the IP substrate 72 is less likely to be degraded. Accordingly, positioning accuracy of the optical connector 73 is improved. Moreover, it is possible to shorten the through via 83 for the optical device 1; therefore, the high-speed electrical signal for the optical device 1 is less likely to be degraded.

<4. Fourth Embodiment> (Third Example of Photoelectric Module)

In the following, description is given of a photoelectric module according to a fourth embodiment of the present disclosure. It is to be noted that substantially same components as the components of the foregoing first to third embodiments are denoted by same reference numerals, and any redundant description thereof is omitted.

[4.1 Configuration Example]

FIG. 24 illustrates a configuration example of the photoelectric module according to the present embodiment. The photoelectric module illustrated in FIG. 24 has an opening 77 that penetrates through the IP substrate 72 in place of the depressed section 76 of the IP substrate 72 in the photoelectric module according to the third embodiment (FIG. 23). Moreover, the photoelectric module includes a holding substrate 80 on which the optical device 1 is mounted. The optical device 1 is mounted on the FEIC 2 with a solder bump 81 in between to be fit into the opening 77 while being mounted on the holding substrate 80. The optical device 1 and the FEIC 2 are electrically connected to each other not through the IP substrate 72 but through the holding substrate 80. A through via 83 for electrical connection between the optical device 1 and the FEIC 2 is provided in the holding substrate 80.

FIG. 25 illustrates another configuration example of the photoelectric module according to the present embodiment. In the configuration example in FIG. 25, the optical device 1 and the FEIC 2 are electrically connected to each other through the holding substrate 80 and the IP substrate 72 without providing the opening 77 that penetrates through the IP substrate 72. In the configuration example in FIG. 25, as with the foregoing third embodiment, the depressed section 75 is provided in the IP substrate 72, and the holding substrate 80 on which the optical device 1 is mounted is fit into the depressed section 76. However, the holding substrate 80 on which the optical device 1 is mounted may be mounted on a substrate surface of the IP substrate 76 without providing the depressed section 76.

[4.2 Workings and Effects]

According to the photoelectric module of the present embodiment, the following workings and effects are achievable.

Inspection of the optical device 1 mounted on the holding substrate 80 is possible before being mounted on the IP substrate 72 or the FEIC 2. This makes it possible to mount only the optical device 1 that is a KGD (Known Good Die) on a photoelectric package. Accordingly, yield as the photoelectric package is easily secured.

<5. Fifth Embodiment> (Optimization of Optical Connector)

In the following, description is given of a photoelectric module according to a fifth embodiment of the present disclosure. It is to be noted that substantially same components as the components of the foregoing first to fourth embodiments are denoted by same reference numerals, and any redundant description thereof is omitted.

The present embodiment relates to a configuration of an optical connector that is optically coupled to the photoelectric module. It is to be noted that the configuration of the optical connector is described with reference to a case in which the optical device 1 and the photoelectric module 40 according to the foregoing first and second embodiments are used; however, the same applies to a case in which the photoelectric modules according to the foregoing third and fourth embodiments are used.

[5.1 Configuration Example of Optical Connector Module]

FIGS. 26 and 27 each illustrate an example of a vertical extraction type optical connector module 100. The photoelectric module 40 is connected to the optical connector module 100 through the dowel pin 51. The optical connector module 100 includes a lens substrate 110 and a ferrule 102. A lens section 111 is provided in the lens substrate 110 at a position corresponding to the optical device 1 mounted on the photoelectric module 40. An optical fiber 101 as an optical transmission medium is installed into the ferrule 102. The optical fiber 101 is disposed in a direction perpendicular to the substrate surface of the lens substrate 110. Light enters the optical fiber 101 in the perpendicular direction through the lens section 111. Alternatively, the optical fiber 101 emits, toward the lens section 111, light transmitted from outside.

FIG. 28 illustrates an example of a horizontal extraction type optical connector module 100A using a mirror. The photoelectric module 40 is connected to the optical connector module 100A through the dowel pin 51. The optical connector module 100A includes the lens substrate 110 and a reflective mirror 120 having a rear surface provided with a reflective film 121. The reflective mirror 120 is disposed at a position corresponding to the optical device 1 mounted on the photoelectric module 40. The optical fiber 101 as the optical transmission medium is installed on the lens substrate 110. The optical fiber 101 is disposed in a direction lateral (parallel) to the substrate surface of the lens substrate 110. The optical fiber 101 is so disposed that an end thereof faces the reflective mirror 120.

FIG. 29 illustrates an example of a horizontal extraction type optical connector module 100B using a total reflective mirror. The optical connector module 100B includes a total reflection mirror 122 in place of the reflective mirror 120 in the optical connector module 100A illustrated in FIG. 28.

FIG. 30 illustrates an example of a horizontal extraction type optical connector module 100C using a waveguide with a total reflective mirror. The optical connector module 100C includes a total reflection mirror 131 in place of the reflective mirror 120 in the optical connector module 100A illustrated in FIG. 28. Moreover, the optical connector module 100C includes a waveguide 130 in place of the optical fiber 10. The total reflection mirror 131 is formed by making a cut 132 in a part of the waveguide 130.

[5.2 Optimization of Optical Connector Module]

(Configuration Example of Optimized Optical Connector Module)

The horizontal extraction type optical connector modules each using the total reflection mirror (FIGS. 29 and 30) in the foregoing configuration examples of the optical connector module may preferably have a configuration as illustrated in FIG. 31 or FIG. 32. It is to be noted that a case in which the optical fiber is used as the optical transmission medium (FIG. 29) is adopted as an example here; however, a similar configuration makes it possible to optimize the optical connector module of a waveguide type (FIG. 30).

In the following, description is given of a case in which a reception-use optical device 1R and a transmission-use optical device 1T are included as the optical devices 1 as an example. The reception-use optical device 1R includes a light receiving element as the light emitting/receiving element 20. The transmission-use optical device 1T includes a light emitting element 20T as the light emitting/receiving element 20.

The optical connector module illustrated in FIG. 31 or FIG. 32 includes a transmission-use optical system 5T corresponding to the transmission-use optical device 1T and a reception-use optical system 5R corresponding to the reception-use optical device 1R.

The transmission-use optical system 5T includes a transmission-use lens 111T where transmitted light emitted from the light emitting element 20T enters in the form of a parallel light flux, and a transmission-use total reflection mirror 122T that reflects the transmitted light that has entered the transmission-use lens 111T. The transmission-use optical system 5T further includes a transmission-use optical fiber 101T as a transmission-use optical transmission medium that transmits the transmitted light reflected by the transmission-use total reflection mirror 122T.

The reception-use optical system 5R includes a reception-use optical fiber 101R as a reception-use optical transmission medium and a reception-use total reflection mirror 122R that reflects the received light transmitted through the reception-use optical fiber 101R. The reception-use optical system 5R further includes a reception-use lens 111R that emits, toward the light receiving element 20R, the received light in the form of a parallel light flux that has been reflected by the reception-use total reflection mirror 122R.

Herein, the optical connector module illustrated in FIG. 31 has a configuration in which a distance D2t between the transmission-use lens 111T and the transmission-use total reflection mirror 122T is different from a distance D2r between the reception-use lens 111R and the reception-use total reflection mirror 122R. The optical connector module also has a configuration in which an optical path length of an incident parallel light flux that enters the transmission-use lens 111T is different from an optical path length of an emission parallel light flux that is emitted from the reception-use lens 111R. Further, the optical connector module has a configuration in which a distance between the light receiving element 20R and the reception-use total reflection mirror 122R is substantially equal to a distance between the light emitting element 20T and the transmission-use total reflection mirror 122T. Alternatively, the optical connector module has a configuration in which a distance between the light receiving element 20R and the reception-use optical fiber 101R is substantially equal to a distance between the light emitting element 20T and the transmission-use optical fiber 101T.

Moreover, the optical connector module illustrated in FIG. 32 has a configuration in which the transmission-use optical fiber 101T and the reception-use optical fiber 101R are inclined with respect to the substrate surface where the transmission-use lens 111T and the reception-use lens 111R are formed of the lens substrate 110.

The optical connector module illustrated in FIG. 32 also has a configuration in which the transmission-use total reflection mirror 122T is disposed at a position offset to a direction where transmitted light is reflected with respect to an optical axis C1 of the transmission-use lens 111T. The optical connector module also has a configuration in which the first surface of an optical substrate 11 in the optical function element array 10 is substantially parallel to the substrate surface where the transmission-use lens 111T is formed of the lens substrate 110.

The optical connector module illustrated in FIG. 32 also has a configuration in which the reception-use total reflection mirror 122R is disposed at a position offset to a direction where the received light is transmitted with respect to an optical axis C2 of the reception-use lens 111R. The optical connector module also has a configuration in which the first surface of the optical substrate 11 in the optical function element array 10 is substantially parallel to the substrate surface where the reception-use lens 111R is formed of the lens substrate 110.

(Optical Design Example without Using Total Reflection Mirror)

First, with reference to FIG. 33, description is given of a procedure of optical design between the optical device 1 (the reception-use optical device 1R and the transmission-use optical device t1) and the optical connector module in a case in which an optical connector module corresponding to the vertical extraction type optical connector module 100 illustrated in FIGS. 26 and 27 is used.

First, a parallel light flux diameter D1 between the optical device 1 and the optical connector module is determined. When the light flux diameter D1 increases, resistance to misalignment, inclination, and adhesion of foreign matters increases. When the light flux diameter D1 decreases, resistance to light crosstalk increases.

Next, a space D2 between an end surface of the optical fiber 101 (the reception-use optical fiber 101R and the transmission-use optical fiber 101T) and the lens 111 (the reception-use lens 111R and the transmission-use lens 111T) is determined. At this occasion, in the vertical extraction type optical connector module 100, design may be common on both emission side and incidence side.

Moreover, a similar design technique may be adopted in the horizontal extraction type optical connector module 100A using the reflective mirror 120 illustrated in FIG. 28. FIG. 34 illustrates an example of optical design between the optical device 1 (the reception-use optical device 1R and the transmission-use optical device 1T) and the optical connector module in a case in which an optical connector corresponding to the horizontal extraction type optical connector module 100A illustrated in FIG. 28 is used. It is to be noted that, in a configuration example in FIG. 34, a reception-use reflective mirror 120R and a transmission-use reflective mirror 120T each of which has a rear surface provided with a reflective film 121 are included as the reflective mirror 120.

(Optical Design Example Using Total Reflection Mirror)

In the following, with reference to FIGS. 35 to 37, description is given of an optical design example between the optical device 1 (the reception-use optical device 1R and the transmission-use optical device 1T) and the optical connector module in a case in which the horizontal extraction type optical connector module using the total refection mirror is used.

In a case in which a horizontal extraction configuration using the total reflection mirror 122 (the reception-use total reflection mirror 122R and the transmission-use total reflection mirror 122T) is applied as illustrated in FIG. 35, in the transmission-use total reflection mirror 122T, for example, a light component La beyond 3.2° in a reflection direction from the optical axis C1 of the transmission-use lens 111T is not totally reflected, and the entire light component La is lost.

Accordingly, the distance D2t between the transmission-use lens 111T on the incidence side and the transmission-use total reflection mirror 122T is increased to decrease an NA. This makes it possible to achieve optical design in which, for example, the component La beyond 3.2° in the reflection direction from the optical axis C2 is reduced. At this occasion, when the distance D2r between the reception-use lens 111R on the emission side and the reception-use total reflection mirror 122R increases, a parallel light diameter increases, thereby deteriorating resistance to light crosstalk. Hence, it may be preferable not to change optical design on the emission side.

Moreover, in order to prevent an increase in costs, positions in the vertical direction of the reception-use optical fiber 101R and the transmission-use optical fiber 101T may be desirably the same. Therefore, as illustrated in FIG. 31, the distance of the parallel light flux is changed to cause a distance between the light receiving element 20R and the reception-use optical fiber 101R and a distance between the light emitting element 20T and the transmission-use optical fiber 101T to be substantially equal to each other. Alternatively, the distance between the light receiving element 20R and the reception-use total reflection mirror 122R and the distance between the light emitting element 20T and the transmission-use total reflection mirror 122T are caused to be substantially equal to each other.

Alternatively, the position of the total reflection mirror 122 at least on the incidence side may be offset as illustrated in FIG. 37. In other words, the position of the transmission-use total reflection mirror 122T may be disposed at a position offset in a direction where transmitted light is reflected with respect to the optical axis C2 of the transmission-use lens 111T. A loss component La of light may be thereby reduced.

Moreover, a loss region is present on fiber side; therefore, the transmission-use lens 111T and the reception-use lens 111R may be offset as illustrated in FIG. 32, and the transmission-use optical fiber 101T and the reception-use optical fiber 101R may be inclined with respect to the substrate surface of the lens substrate 110. This makes it possible to further reduce light loss.

[5.3 Workings and Effects]

According to the present embodiment, the optimized configuration of the horizontal extraction optical connector module using the total reflection mirror makes it possible to reduce total reflection loss while suppressing light crosstalk between channels. This leads to a reduction in transmission loss in the entire system.

6. Other Embodiments

The technology achieved by the present disclosure is not limited to the foregoing respective embodiments, and may be modified in a variety of ways.

The present technology may have the following configurations, for example.

(1) A photoelectric module, including:

an optical device including an optical function element array made of a first base material, and a plurality of light emitting/receiving elements made of a second base material, wherein the optical function element array includes an optical substrate and a plurality of optical function elements, the optical substrate having a first surface and a second surface, and the optical function elements being integrated with the optical substrate and being arranged one-dimensionally or two-dimensionally, and the light emitting/receiving elements and their respective optical function elements face each other with the optical substrate in between to be located on a same axis in a direction perpendicular to the optical substrate, and the light emitting/receiving elements are disposed on the second surface with a space in between while being separated in units of a smaller number than array number in the optical function element array.

(2) The photoelectric module according to (1), further including front end circuits that drive the respective light emitting/receiving elements, wherein wiring lengths between the light emitting/receiving elements and their respective front end circuits are substantially equal.

(3) The photoelectric module according to (1) or (2), further including:

a first solder bump that is in contact with the second surface of the optical substrate and is electrically connected to the optical substrate; and a second solder bump that is provided for each of the light emitting/receiving elements and is electrically connected to each of the light emitting/receiving elements.

(4) The photoelectric module according to any one of (1) to (3), further including:

a front end IC having one surface on which the optical device is mounted; and an interposer substrate on which the front end IC and the optical device are mounted, and that electrically connects the front end IC to a mother board, wherein the interposer substrate includes a first substrate being bonded to the other surface of the front end IC, a second substrate being bonded to the first substrate and having an IC-mounting opening for mounting of the front end IC on the first substrate, and a third substrate being disposed between the front end IC and the mother board without contacting the mother board, and having a light input/output opening for optical transmission that is to be performed by the optical device.

(5) The photoelectric module according to (4), wherein the first substrate has higher heat dissipation and higher rigidity than the second substrate, the second substrate has a connection configuration in which the second substrate is electrically connected to the front end IC through the third substrate, and electrically connects the third substrate and the mother board to each other, and the third substrate has a connection configuration in which the third substrate electrically connects the front end IC and the second substrate to each other.

(6) The photoelectric module according to (4) or (5), further including a positioning member for mounting of an optical connector, wherein the first substrate has higher heat dissipation and higher rigidity than the second substrate, and a temperature of the first substrate is controlled by an external cooling medium, and an end surface of the positioning member, the other surface of the front end IC, and one substrate surface of the second substrate are bonded to one substrate surface of the first substrate as a whole without space.

(7) The photoelectric module according to any one of (4) to (6), wherein electrical connection between the front end IC and the mother board is established through the second substrate and a surface section of the third substrate without penetration through the second substrate and the third substrate.

(8) The photoelectric module according to any one of (1) to (3), further including an interposer substrate having a multilayer configuration that electrically connects the optical device and the front end IC to each other, wherein the interposer substrate has a depressed section, the depressed section being formed by reducing the number of substrates layers to be smaller than the number of substrate layers in a region other than the depressed section, and the optical device is mounted on the interposer substrate to be fit into the depressed section.

(9) The photoelectric module according to any one of (1) to (3), further including:

an interposer substrate;

a front end IC that is electrically connected to the optical device; and a holding substrate on which the optical device is mounted, wherein the optical device is mounted on the front end IC or the interposer substrate while being mounted on the holding substrate.

(10) The photoelectric module according to (9), wherein the interposer substrate has an opening that penetrates through the interposer substrate, the optical device is mounted on the front end IC to be fit into the opening while being mounted on the holding substrate, and the optical device and the front end IC are electrically connected to each other not through the interposer substrate but through the holding substrate.

(11) The photoelectric module according to (9), wherein the optical device is mounted on the interposer substrate while being mounted on the holding substrate, and the optical device and the front end IC are electrically connected to each other through the holding substrate and the interposer substrate.

(12) The photoelectric module according to any one of (1) to (11), further including an optical connector that includes a transmission-use optical system and a reception-use optical system, and is optically coupled to the optical device, wherein the plurality of light emitting/receiving elements include a light receiving element and a light emitting element, the transmission-use optical system includes a transmission-use lens, a transmission-use total reflection mirror, and a transmission-use optical transmission medium, the transmission-use lens where transmitted light emitted from the light emitting element enters in form of a parallel light flux, the transmission-use total reflection mirror that reflects the transmitted light having entered the transmission-use lens, and the transmission-use optical transmission medium that transmits the transmitted light reflected by the transmission-use total reflection mirror, and the reception-use optical system includes a reception-use optical transmission medium, a reception-use total reflection mirror, and a reception-use lens, the reception-use total reflection mirror that reflects received light transmitted by the reception-use optical transmission medium, and the reception-use lens that emits, toward the light receiving element, the received light in the form of a parallel light flux that has been reflected by the reception-use total reflection mirror.

(13) The photoelectric module according to (12), wherein a distance between the transmission-use lens and the transmission-use total reflection mirror is different from a distance between the reception-use lens and the reception-use total reflection mirror, and an optical path of an incident parallel light flux that enters the transmission-use lens is different from an optical path length of an emission parallel light flux that is emitted from the reception-use lens, and a distance between the light receiving element and the reception-use total reflection mirror is substantially equal to a distance between the light emitting element and the transmission-use total reflection mirror, or a distance between the light receiving element and the reception-use optical transmission medium is substantially equal to a distance between the light emitting element and the transmission-use optical transmission medium.

(14) The photoelectric module according to (12), wherein the transmission-use optical system further includes a lens substrate on which the transmission-use lens is formed, and the transmission-use total reflection mirror is disposed at a position offset to a direction where the transmitted light is reflected with respect to an optical axis of the transmission-use lens, and the first surface of the optical substrate in the optical function element array is substantially parallel to a substrate surface where the transmission-use lens is formed of the lens substrate.

(15) The photoelectric module according to any one of (12) to (14), wherein the optical connector further includes a lens substrate on which the transmission-use lens and the reception-use lens are formed, and the transmission-use optical transmission medium and the reception-use optical transmission medium are inclined with respect to a substrate surface where the transmission-use lens and the reception-use lens are formed of the lens substrate.

(16) An optical device, including:

an optical function element array made of a first base material; and a plurality of light emitting/receiving elements made of a second base material, wherein the optical function element array includes an optical substrate and a plurality of optical function elements, the optical substrate having a first surface and a second surface, and the optical function elements being integrated with the optical substrate and being arranged one-dimensionally or two-dimensionally, and the light emitting/receiving elements and their respective optical function elements face each other with the optical substrate in between to be located on a same axis in a direction perpendicular to the optical substrate, and the light emitting/receiving elements are disposed on the second surface with a space in between while being separated in units of a smaller number than array number in the optical function element array.

(17) The optical device according to (16), wherein the plurality of light emitting/receiving elements are mounted on the second surface of the optical substrate by a solder bump.

This application claims the priority on the basis of Japanese Patent Application No. 2014-099695 filed on May 13, 2014 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A photoelectric module, comprising:
an optical device including an optical function element array made of a first base material, and a plurality of light emitting/receiving elements made of a second base material,
wherein the optical function element array includes an optical substrate and a plurality of optical function elements, the optical substrate having a first surface and a second surface, and the optical function elements being integrated with the optical substrate and being arranged one-dimensionally or two-dimensionally, and
the light emitting/receiving elements and their respective optical function elements face each other with the optical substrate in between to be located on a same axis in a direction perpendicular to the optical substrate, and the light emitting/receiving elements are disposed on the second surface with a space in between while being separated in units of a smaller number than array number in the optical function element array; and
a plurality of front end circuits, wherein wiring lengths between the light emitting/receiving elements and their respective front end circuits are substantially equal.

2. The photoelectric module according to claim 1, further comprising:

a first solder bump that is in contact with the second surface of the optical substrate and is electrically connected to the optical substrate; and a second solder bump that is provided for each of the light emitting/receiving elements and is electrically connected to each of the light emitting/receiving elements.

3. The photoelectric module according to claim 1, further comprising:

a front end IC having one surface on which the optical device is mounted; and an interposer substrate on which the front end IC and the optical device are mounted, and that electrically connects the front end IC to a mother board, wherein the interposer substrate includes a first substrate being bonded to the other surface of the front end IC, a second substrate being bonded to the first substrate and having an IC-mounting opening for mounting of the front end IC on the first substrate, and a third substrate being disposed between the front end IC and the mother board without contacting the mother board, and having a light input/output opening for optical transmission that is to be performed by the optical device.

4. The photoelectric module according to claim 3, wherein the first substrate has higher heat dissipation and higher rigidity than the second substrate, the second substrate has a connection configuration in which the second substrate is electrically connected to the front end IC through the third substrate, and electrically connects the third substrate and the mother board to each other, and the third substrate has a connection configuration in which the third substrate electrically connects the front end IC and the second substrate to each other.

5. The photoelectric module according to claim 3, further comprising a positioning member for mounting of an optical connector, wherein the first substrate has higher heat dissipation and higher rigidity than the second substrate, and a temperature of the first substrate is controlled by an external cooling medium, and an end surface of the positioning member, the other surface of the front end IC, and one substrate surface of the second substrate are bonded to one substrate surface of the first substrate as a whole without space.

6. The photoelectric module according to claim 3, wherein electrical connection between the front end IC and the mother board is established through the second substrate and a surface section of the third substrate without penetration through the second substrate and the third substrate.

7. The photoelectric module according to claim 1, further comprising an interposer substrate having a multilayer configuration that electrically connects the optical device and the front end IC to each other, wherein the interposer substrate has a depressed section, the depressed section being formed by reducing the number of substrate layers to be smaller than the number of substrate layers in a region other than the depressed section, and the optical device is mounted on the interposer substrate to be fit into the depressed section.

8. The photoelectric module according to claim 1, further comprising:

an interposer substrate;

a front end IC that is electrically connected to the optical device; and a holding substrate on which the optical device is mounted, wherein the optical device is mounted on the front end IC or the interposer substrate while being mounted on the holding substrate.

9. The photoelectric module according to claim 8, wherein the interposer substrate has an opening that penetrates through the interposer substrate, the optical device is mounted on the front end IC to be fit into the opening while being mounted on the holding substrate, and the optical device and the front end IC are electrically connected to each other not through the interposer substrate but through the holding substrate.

10. The photoelectric module according to claim 8, wherein the optical device is mounted on the interposer substrate while being mounted on the holding substrate, and the optical device and the front end IC are electrically connected to each other through the holding substrate and the interposer substrate.

11. The photoelectric module according to claim 1, further comprising an optical connector that includes a transmission-use optical system and a reception-use optical system, and is optically coupled to the optical device, wherein the plurality of light emitting/receiving elements include a light receiving element and a light emitting element, the transmission-use optical system includes a transmission-use lens, a transmission-use total reflection mirror, and a transmission-use optical transmission medium, the transmission-use lens where transmitted light emitted from the light emitting element enters in form of a parallel light flux, the transmission-use total reflection mirror that reflects the transmitted light having entered the transmission-use lens, and the transmission-use optical transmission medium that transmits the transmitted light reflected by the transmission-use total reflection mirror, and the reception-use optical system includes a reception-use optical transmission medium, a reception-use total reflection mirror, and a reception-use lens, the reception-use total reflection mirror that reflects received light transmitted by the reception-use optical transmission medium, and the reception-use lens that emits, toward the light receiving element, the received light in the form of a parallel light flux that has been reflected by the reception-use total reflection mirror.

12. The photoelectric module according to claim 11, wherein a distance between the transmission-use lens and the transmission-use total reflection mirror is different from a distance between the reception-use lens and the reception-use total reflection mirror, and an optical path of an incident parallel light flux that enters the transmission-use lens is different from an optical path length of an emission parallel light flux that is emitted from the reception-use lens, and a distance between the light receiving element and the reception-use total reflection mirror is substantially equal to a distance between the light emitting element and the transmission-use total reflection mirror, or a distance between the light receiving element and the reception-use optical transmission medium is substantially equal to a distance between the light emitting element and the transmission-use optical transmission medium.

13. The photoelectric module according to claim 11, wherein
the transmission-use optical system further includes a lens substrate on which the transmission-use lens is formed, and
the transmission-use total reflection mirror is disposed at a position offset to a direction where the transmitted light is reflected with respect to an optical axis of the transmission-use lens, and the first surface of the optical substrate in the optical function element array is substantially parallel to a substrate surface where the transmission-use lens is formed of the lens substrate.

14. The photoelectric module according to claim 11, wherein
the optical connector further includes a lens substrate on which the transmission-use lens and the reception-use lens are formed, and
the transmission-use optical transmission medium and the reception-use optical transmission medium are inclined with respect to a substrate surface where the transmission-use lens and the reception-use lens are formed of the lens substrate.

15. An optical device, comprising:
an optical function element array made of a first base material; and
a plurality of light emitting/receiving elements made of a second base material, wherein the optical function element array includes an optical substrate and a plurality of optical function elements, the optical substrate having a first surface and a second surface, and the optical function elements being integrated with the optical substrate and being arranged one-dimensionally or two-dimensionally,
wherein the plurality of light emitting/receiving elements are mounted on the second surface of the optical substrate by a plurality of self-aligning solder bumps, and
the light emitting/receiving elements and their respective optical function elements face each other with the optical substrate in between to be located on a same axis in a direction perpendicular to the optical substrate, and the light emitting/receiving elements are disposed on the second surface with a space in between while being separated in units of a smaller number than array number in the optical function element array.

16. The optical device of claim 15, wherein the plurality of self-aligning solder bumps include any one of Sn, a Sn—Ag-based material, a Sn—Ag—Cu-based material, and a Sn—Bi-based material.

* * * * *